US009093090B2

(12) United States Patent
Ohsawa

(10) Patent No.: US 9,093,090 B2
(45) Date of Patent: Jul. 28, 2015

(54) SUSPENSION BOARD WITH CIRCUIT

(75) Inventor: Tetsuya Ohsawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 768 days.

(21) Appl. No.: 13/422,692

(22) Filed: Mar. 16, 2012

(65) Prior Publication Data
US 2012/0247824 A1 Oct. 4, 2012

Related U.S. Application Data

(60) Provisional application No. 61/457,562, filed on Apr. 21, 2011.

(30) Foreign Application Priority Data

Mar. 31, 2011 (JP) .................................. 2011-080795

(51) Int. Cl.
H05K 1/11 (2006.01)
G11B 5/48 (2006.01)
H05K 1/02 (2006.01)
H05K 1/05 (2006.01)

(52) U.S. Cl.
CPC ............... G11B 5/486 (2013.01); H05K 1/028 (2013.01); H05K 1/056 (2013.01)

(58) Field of Classification Search
CPC ... H05K 1/028; H05K 1/0283; H05K 1/0281; H05K 1/0277; G11B 5/486; G11B 5/4826
USPC .................. 174/254, 260, 261; 361/749, 760; 360/245.8, 244.1, 245.5, 234.5, 245, 360/245.6
See application file for complete search history.

(56) References Cited

U.S. PATENT DOCUMENTS 6,400,529 B1 * 6/2002 Baba et al. ................. 360/234.4
6,459,548 B1 10/2002 Shiraishi et al.
2008/0115962 A1 5/2008 Juni
(Continued)

FOREIGN PATENT DOCUMENTS

JP 01-128279 5/1989
JP 2000-348451 12/2000
JP 2002-216327 8/2002
JP 2002216327 A * 8/2002
(Continued)

OTHER PUBLICATIONS

Notification of Reasons for Refusal, issued by Japanese Patent Office, on Dec. 24, 2014 in connection with Japanese Patent Application No. 2011-080795.

Primary Examiner — Timothy Thompson
Assistant Examiner — Amol Patel
(74) Attorney, Agent, or Firm — Jean C. Edwards, Esq.; Edwards Neils PLLC

(57) ABSTRACT

A suspension board with circuit includes a conductive pattern on a top surface thereof. A folded-back portion that is capable of being folded back toward a back surface side is provided therein. At the circumference edge of the folded-back portion, a part of the circumference edge is continuous to the suspension board with circuit around the folded-back portion via a bent portion and the remaining portion of the circumference edge is disposed apart from the suspension board with circuit around the folded-back portion by a penetrating space that penetrates the suspension board with circuit in a thickness direction. The conductive pattern at least includes a top-surface-side terminal that is disposed on the top surface of the suspension board with circuit and a back-surface-side terminal that is disposed in the folded-back portion.

14 Claims, 18 Drawing Sheets

(56) References Cited

U.S. PATENT DOCUMENTS

| | | | |
|---|---|---|---|
| 2010/0051334 A1* | 3/2010 | Ho et al. ................. | 174/257 |
| 2010/0118443 A1 | 5/2010 | Ohsawa | |
| 2010/0118445 A1 | 5/2010 | Ohsawa | |
| 2010/0188779 A1 | 7/2010 | Ohsawa et al. | |

FOREIGN PATENT DOCUMENTS

| | | |
|---|---|---|
| JP | 2008152899 A | 7/2008 |
| JP | 2010118096 A | 5/2010 |
| JP | 2010118097 A | 5/2010 |
| JP | 2010-170626 | 8/2010 |

* cited by examiner

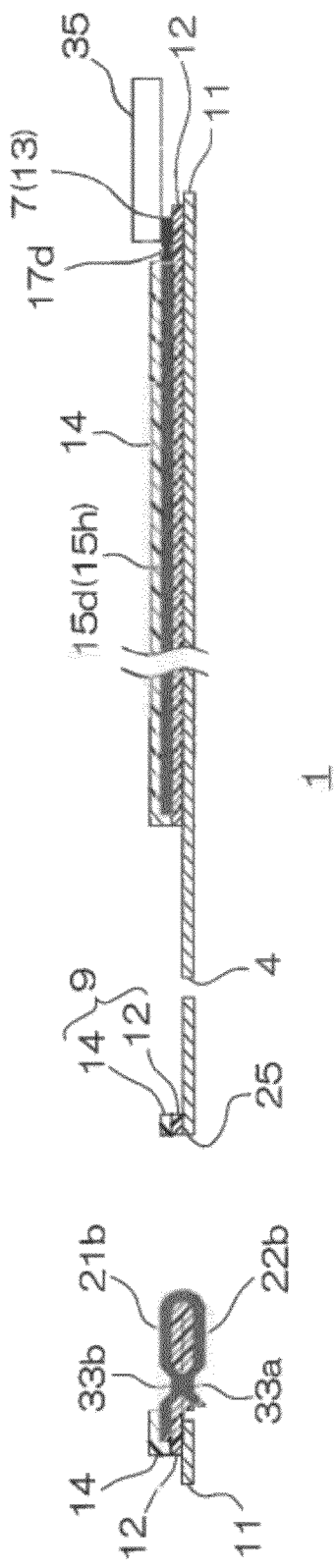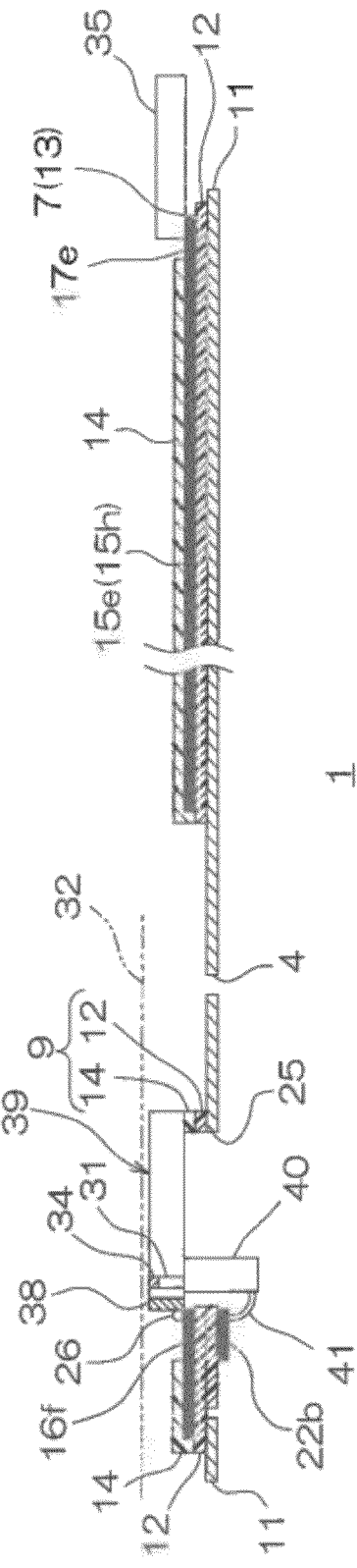

FIG.7
(a)
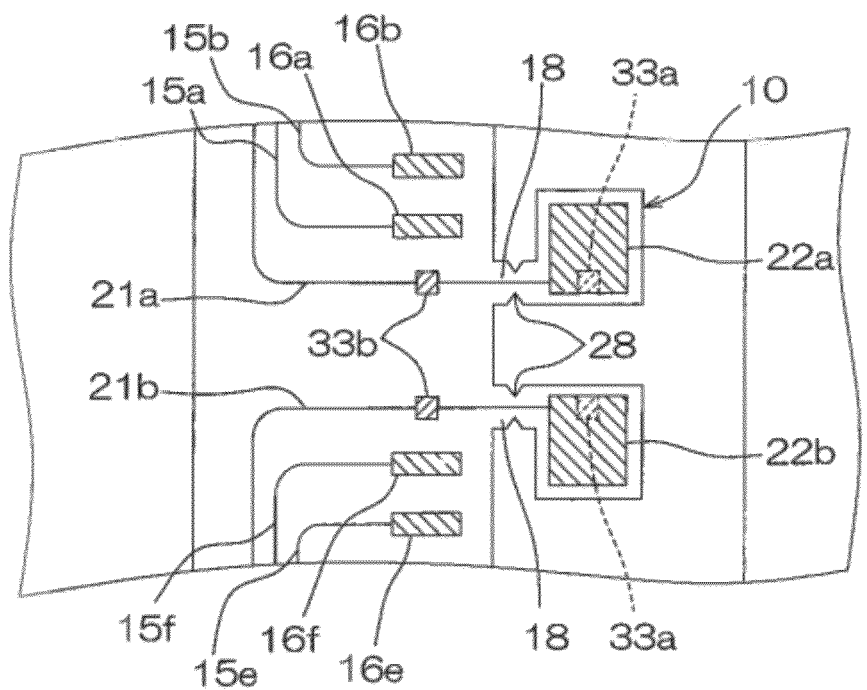
(b)
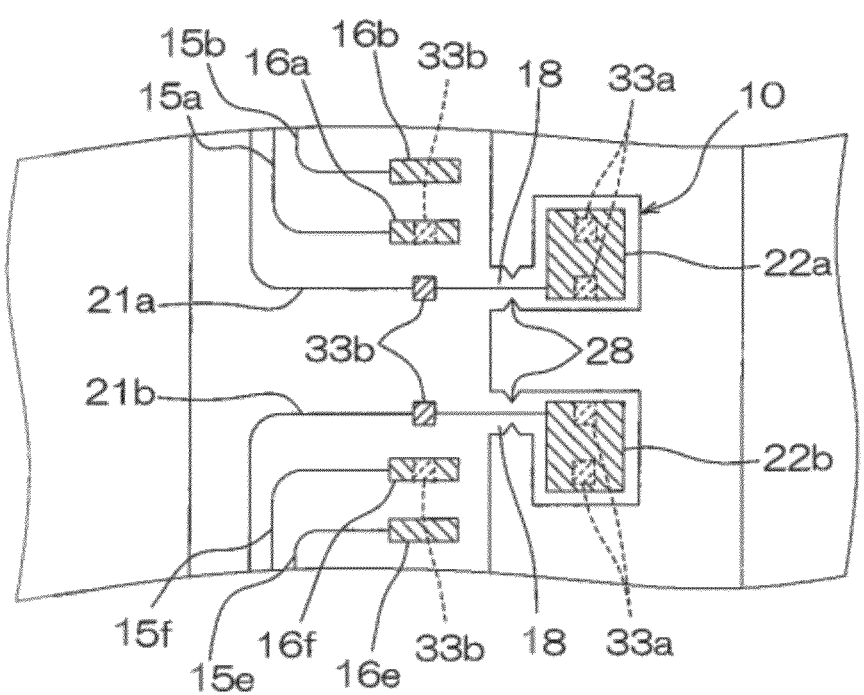

SUSPENSION BOARD WITH CIRCUIT

CROSS-REFERENCE TO RELATED APPLICATION

The present application claims the benefit of U.S. Provisional Application No. 61/457,562 filed on Apr. 21, 2011, and claims priority from Japanese Patent Application No. 2011-080795 filed on Mar. 31, 2011, the contents of which are hereby incorporated by reference into this application.

BACKGROUND OF THE INVENTION

1. Field of the Invention

The present invention relates to a suspension board with circuit, to be specific, to a suspension board with circuit that is used in a hard disk drive.

2. Description of Related Art

Conventionally, a suspension board with circuit is used in a hard disk drive. The suspension board with circuit includes a suspension and a conductive pattern that is formed thereon having a head-side terminal portion for connecting a magnetic head. In the suspension board with circuit, the magnetic head is mounted on the suspension so as to connect the magnetic head to the head-side terminal portion.

In recent years, it has been proposed that various electronic devices such as a light emitting device for improving recording density by an optical assist system, an inspecting device for inspecting a positional accuracy of the magnetic head, and further, a piezoelectric element and a microactuator for finely adjusting a position and an angle of the magnetic head are mounted on the suspension board with circuit.

There has been proposed, for example, as a suspension board with circuit for mounting the electronic device thereon, a suspension board with circuit including a board main body portion where the magnetic head is mounted on a top surface thereof and an auxiliary portion that is formed to be continuous from the board main body portion, provided with a conductive pattern so as to include a first conductive pattern provided with an external-side terminal and a head-side terminal and a second conductive pattern provided with a supply-side terminal and an element-side terminal, and provided so that the external-side terminal, the head-side terminal, and the supply-side terminal are disposed in the board main body portion, and the element-side terminal is disposed in the auxiliary portion, respectively (ref: for example, Japanese Unexamined Patent Publication No. 2010-118096).

In the suspension board with circuit described in Japanese Unexamined Patent Publication No. 2010-118096, after the auxiliary portion is folded back with respect to the board main body portion, a metal supporting board in the board main body portion that is adjacent in the thickness direction and that in the auxiliary portion are connected by welding. In the suspension board with circuit, the magnetic head is electrically connected to the head-side terminal on the top surface thereof, and the element-side terminal that is folded back and is disposed on a back surface side is electrically connected to the electronic device, so that wiring density can be reduced and miniaturization of the suspension board with circuit can be achieved, with respect to the case where all the terminals are disposed on the top surface.

SUMMARY OF THE INVENTION

However, for example, the suspension board with circuit is produced as a suspension board with circuit assembly sheet in which a plurality of the suspension boards with circuits are formed by laminating an insulating layer, the conductive pattern, and the like on one piece of the metal supporting board.

In the assembly sheet, the above-described suspension board with circuit described in Japanese Unexamined Patent Publication No. 2010-118096 is, when formed as a state before being folded back, provided so that the auxiliary portion protrudes from the board main body portion and therefore, a space in which the auxiliary portion is provided in the assembly sheet is required. Therefore, there is a disadvantage that the number of the suspension board with circuit that can be formed in one piece of the assembly sheet is reduced, so that the production efficiency is poor.

It is an object of the present invention to provide a suspension board with circuit that is capable of reducing wiring density, achieving miniaturization, and further, efficiently being produced.

A suspension board with circuit of the present invention includes a conductive pattern on a top surface thereof, wherein a folded-back portion that is capable of being folded back toward a back surface side is provided therein, and at the circumference edge of the folded-back portion, a part of the circumference edge is continuous to the suspension board with circuit around the folded-back portion via a bent portion and the remaining portion of the circumference edge is disposed apart from the suspension board with circuit around the folded-back portion by a penetrating space that penetrates the suspension board with circuit in a thickness direction, wherein the conductive pattern at least includes a top-surface-side terminal that is disposed on the top surface of the suspension board with circuit and a back-surface-side terminal that is disposed in the folded-back portion.

In the suspension board with circuit, at the circumference edge of the folded-back portion that is capable of being folded back, a part of the circumference edge is continuous to the suspension board with circuit around the folded-back portion via the bent portion, and the remaining portion of the circumference edge is disposed apart from the suspension board with circuit around the folded-back portion by the penetrating space that penetrates the suspension board with circuit in the thickness direction.

That is, the folded-back portion is formed at the inner side of the suspension board with circuit. Therefore, it is possible to dispose terminals on the top surface side and the back surface side of the suspension board with circuit to reduce the wiring density and achieve miniaturization. In addition, when produced as an assembly sheet, the suspension board with circuit can be efficiently produced in a space saving manner.

In the suspension board with circuit of the present invention, it is preferable that a slider mounted with a magnetic head is capable of being mounted on the top surface side thereof and an electronic device is capable of being mounted on the back surface side thereof; the conductive pattern includes a first conductive pattern including a first terminal that is to be electrically connected to an external circuit and a second terminal that is to be electrically connected to the magnetic head, and a second conductive pattern including a third terminal that is to be electrically connected to the external circuit and a fourth terminal that is to be electrically connected to the electronic device; and the top-surface-side terminal serves as the second terminal and the back-surface-side terminal serves as the fourth terminal.

In the suspension board with circuit, the second terminal that is to be electrically connected to the magnetic head is formed as the top-surface-side terminal and the fourth terminal that is to be electrically connected to the electronic device is formed as the back-surface-side terminal, so that the terminals can be formed with a low arrangement density. In this way, a short circuit thereof can be prevented. As a result, connecting reliability of the conductive pattern can be improved.

In the suspension board with circuit of the present invention, it is preferable that the second terminal and the fourth terminal are disposed so that in a state where the folded-back portion is folded back, the slider is capable of being opposed to the electronic device, the slider is capable of being connected to the second terminal, and the electronic device is capable of being connected to the fourth terminal.

When the electronic device and the slider are spaced apart from each other at a large interval, there may be a case where a function of the electronic device cannot be fully developed. However, in the suspension board with circuit, the electronic device and the slider are disposed in opposed relation to each other in the thickness direction, so that the electronic device can be disposed in the neighborhood of the slider and therefore, the electronic device can be efficiently operated.

In the suspension board with circuit of the present invention, it is preferable that the conductive pattern includes an auxiliary pad in the folded-back portion and an auxiliary pad in the suspension board with circuit around the folded-back portion, and the auxiliary pads form a pair and in a state where the folded-back portion is folded back, at least one pair of the auxiliary pads are opposed to each other in the thickness direction of the suspension board with circuit and are subjected to ultrasonic bonding, so that the folded-back portion is capable of being fixed to the back surface side of the suspension board with circuit.

In the suspension board with circuit, the auxiliary pads are subjected to the ultrasonic bonding, so that the folded-back portion can be reliably fixed to the back surface side of the suspension board with circuit.

In the suspension board with circuit of the present invention, it is preferable that the conductive pattern includes an auxiliary pad in the folded-back portion and an auxiliary pad in the suspension board with circuit around the folded-back portion, and the auxiliary pads form a pair and in a state where the folded-back portion is folded back, at least one pair of the auxiliary pads are opposed to each other in the thickness direction of the suspension board with circuit and are subjected to solder bonding, so that the folded-back portion is capable of being fixed to the back surface side of the suspension board with circuit.

In the suspension board with circuit, the auxiliary pads are subjected to the solder bonding, so that the folded-back portion can be reliably fixed to the back surface side of the suspension board with circuit.

In the suspension board with circuit of the present invention, it is preferable that a penetrating hole that is capable of being filled with solder is formed in at least one of one pair of the auxiliary pads and by filling the penetrating hole with the solder, at least one pair of the auxiliary pads are capable of being connected to each other.

In the suspension board with circuit, the solder is filled in the penetrating hole, so that the auxiliary pads are subjected to the solder bonding further reliably and therefore, the folded-back portion can be reliably fixed to the back surface side of the suspension board with circuit.

In the suspension board with circuit of the present invention, it is preferable that the penetrating space is capable of allowing the electronic device to penetrate through.

In the suspension board with circuit, the electronic device is allowed to penetrate through the penetrating space to be mounted thereon, so that it is possible to achieve a thinner suspension board with circuit.

In the suspension board with circuit of the present invention, it is preferable that at least one pair of the folded-back portions and at least one pair of the fourth terminals are provided, and in a state where the folded-back portion is folded back, at least one pair of the fourth terminals are disposed so as to sandwich the penetrating space.

In the suspension board with circuit, the fourth terminals to be electrically connected to the electronic device are disposed so as to sandwich the penetrating space, so that the electronic device can be connected to the conductive pattern in two directions. Therefore, the terminal connecting the electronic device to the conductive pattern can be disposed in a dispersed manner, so that the wiring density can be reduced and therefore, the short circuit can be prevented and the connecting reliability can be improved, compared to the case where the electronic device is connected to the conductive pattern in one direction.

In the suspension board with circuit of the present invention, it is preferable that the electronic device serves as a light emitting device and the slider includes an optical waveguide and a near-field light generation member.

In the suspension board with circuit, light emitted from the light emitting device enters the optical waveguide of the slider, so that an optical assist system can be efficiently performed due to heating by near-field light that is converted from the light in the optical waveguide, and a magnetic field of the magnetic head.

In the suspension board with circuit of the present invention, it is preferable that the penetrating space is disposed so that in a state where the folded-back portion is folded back, the light emitted from the light emitting device is allowed to pass through to enter the optical waveguide.

In the suspension board with circuit, in a case of being mounted with the light emitting device, the light emitted from the light emitting device passes through the penetrating space, so that the light is not blocked and therefore, the optical assist system can be efficiently performed.

In the suspension board with circuit of the present invention, it is preferable that the electronic device serves as an inspecting device.

In the suspension board with circuit, the inspecting device is mounted as the electronic device, so that the position, the angle, and the like of the magnetic head and the slider in the suspension board with circuit can be inspected.

In the suspension board with circuit of the present invention, it is preferable that the electronic device is capable of being disposed so as to cross over the penetrating space.

In the suspension board with circuit, the electronic device is disposed so as to cross over the penetrating space, so that the electronic device is provided so as to be spaced apart from the slider at a predetermined interval and therefore, the short circuit of the conductive pattern and the like can be prevented.

In the suspension board with circuit of the present invention, it is preferable that the electronic device serves as a piezoelectric element.

In the suspension board with circuit, the piezoelectric element is mounted as the electronic device, so that the position, the angle, and the like of the magnetic head can be finely adjusted.

BRIEF DESCRIPTION OF THE DRAWINGS

FIG. 5 shows a sectional view, taken along the line B-B of the suspension board with circuit in FIG. 4.

FIG. 6 shows a sectional view, taken along the line C-C of the suspension board with circuit in FIG. 4.

FIG. 7 shows an enlarged plan view of an essential part of another embodiment of the suspension board with circuit:
(a) illustrating an embodiment in which an auxiliary pad is formed as a back surface of an element-side terminal and
(b) illustrating an embodiment in which the auxiliary pad is formed as the back surface of the conductive pattern and the element-side terminal.

DETAILED DESCRIPTION OF THE INVENTION

Figure 1:
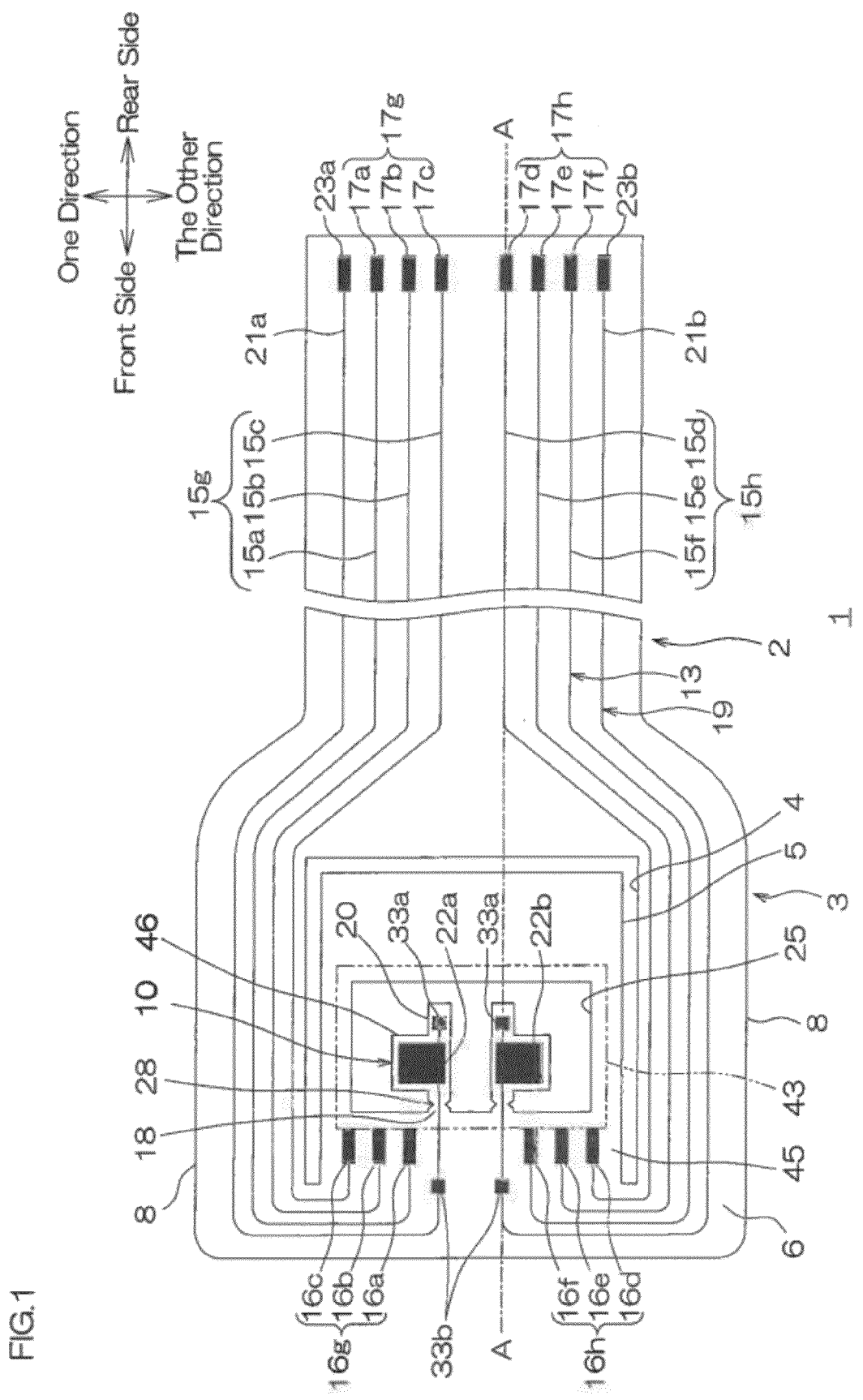
FIG. 1 shows a plan view of one embodiment of a suspension board with circuit of the present invention.
Figure 2:
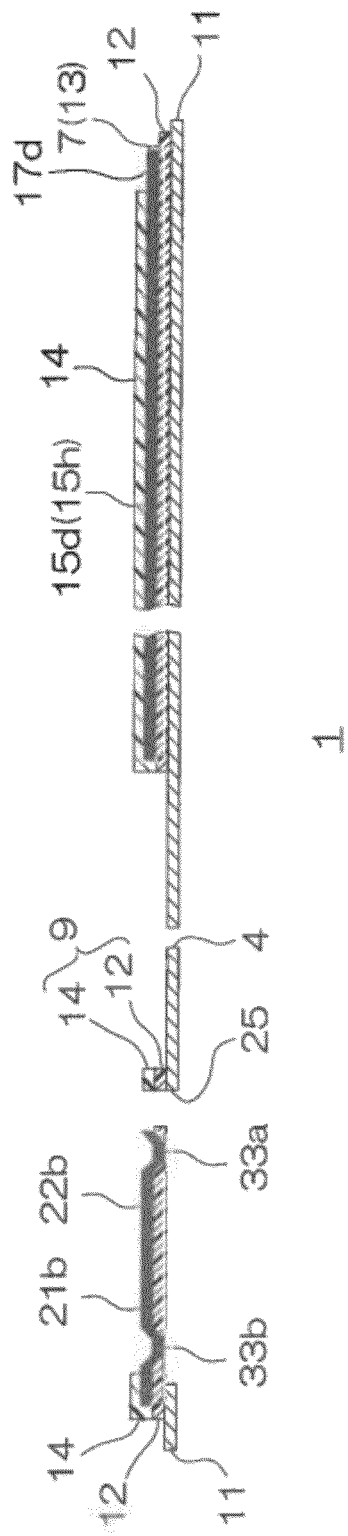
FIG. 2 shows a sectional view, taken along the line A-A of the suspension board with circuit shown in FIG. 1.
Figure 3:
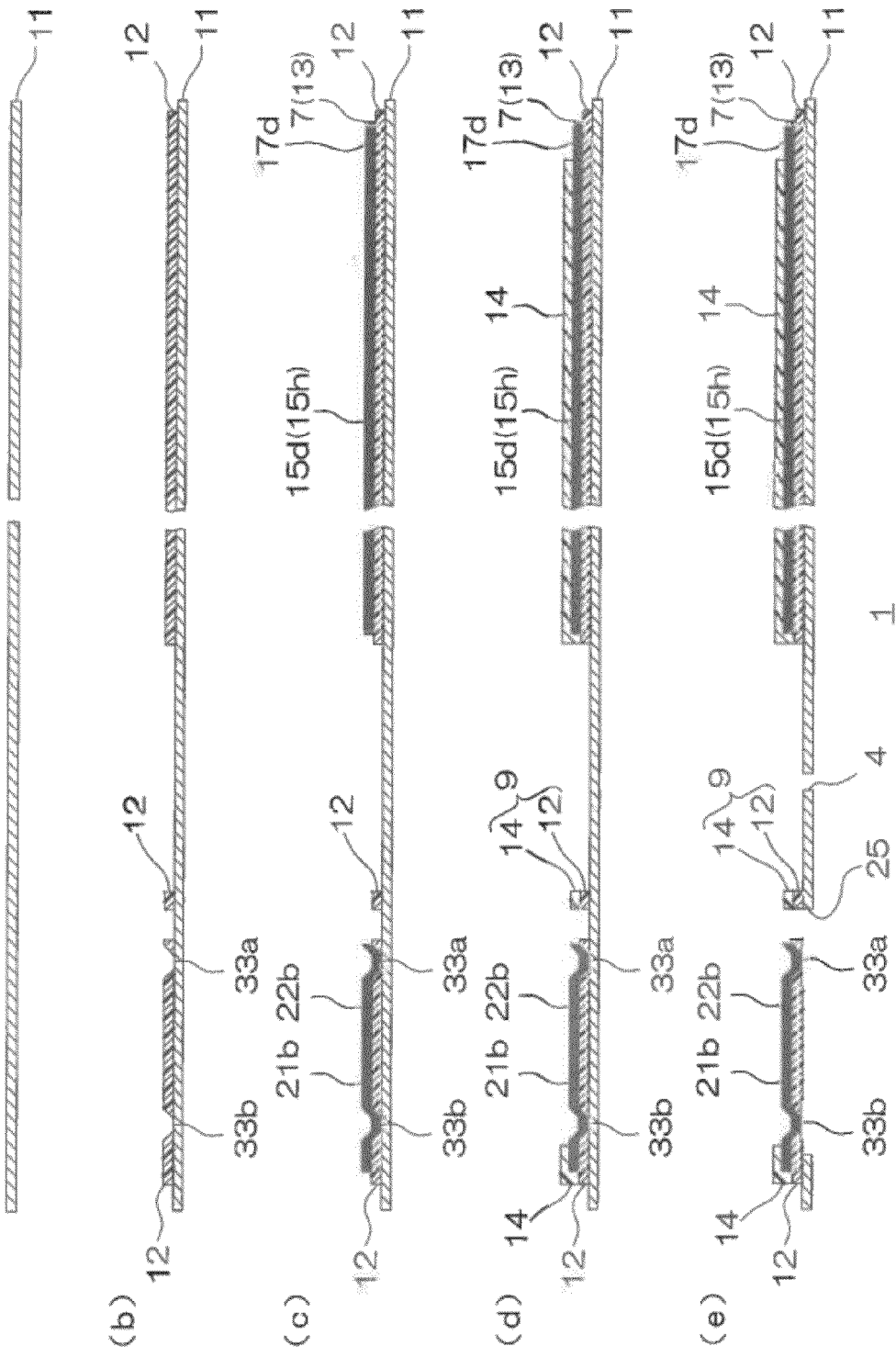
FIG. 3 shows process drawings for describing a method for producing the suspension board with circuit shown in FIG. 1:
(a) illustrating a step of preparing a metal supporting board,
(b) illustrating a step of forming an insulating base layer,
(c) illustrating a step of forming a conductive pattern,
(d) illustrating a step of forming an insulating cover layer, and
(e) illustrating a step of removing the metal supporting board in regions corresponding to a slit, a slider mounting portion, and a head-side terminal forming portion.
Figure 4:
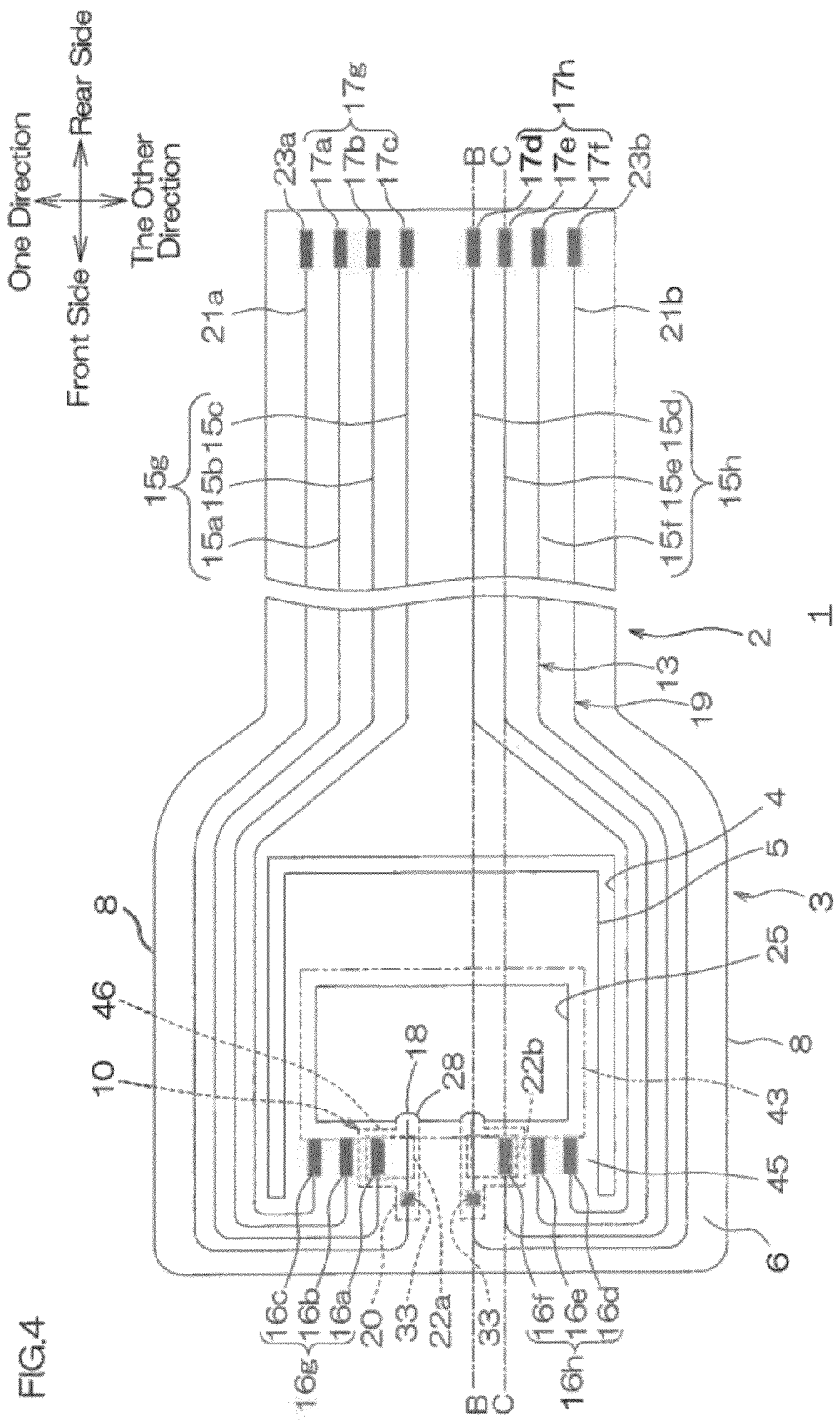
FIG. 4 shows a plan view illustrating a state where a folded-back portion is folded back in the suspension board with circuit in FIG. 1.

FIG. 1 shows a plan view of one embodiment of a suspension board with circuit of the present invention. FIG. 2 shows a sectional view, taken along the line A-A of the suspension board with circuit shown in FIG. 1. FIG. 3 shows process drawings for describing a method for producing the suspension board with circuit shown in FIG. 1. FIGS. 4 to 6 illustrate a state where a folded-back portion is folded back in the suspension board with circuit in FIG. 1: FIG. 4 showing a plan view, FIG. 5 showing a sectional view, taken along the line B-B in FIG. 4, and FIG. 6 showing a sectional view, taken along the line C-C in FIG. 4.

In FIGS. 1 and 4, an insulating cover layer 14 to be described later is omitted so as to clearly show the relative arrangement of a conductive pattern 7 to be described later.

In FIGS. 1 and 2, though the details are described later, a suspension board with circuit 1 includes, on a top surface, the conductive pattern 7 and a folded-back portion 10 that is capable of being folded back toward a back surface side.

The suspension board with circuit 1 is capable of being mounted with a slider 39 mounted with a magnetic head 38 to be described later on the top surface side and being mounted with a light emitting device 40, as an electronic device, to be described later on the back surface side. As referred in FIGS. 4 to 6, the folded-back portion 10 is folded back, and the slider 39 mounted with the magnetic head 38 and the light emitting device 40 to be described later are mounted on the suspension board with circuit 1 to be used in a hard disk drive that uses an optical assist system.

In the suspension board with circuit 1, the conductive pattern 7 is supported by the top surface of a metal supporting board 11.

The metal supporting board 11 is formed into a flat belt shape extending in a lengthwise direction (a front-rear direction) and integrally includes a wire portion 2 that is disposed at the other side in the lengthwise direction (hereinafter, referred to as the rear side) and a mounting portion 3 that is disposed at one side in the lengthwise direction of the wire portion 2 (hereinafter, referred to as the front side).

The wire portion 2 is formed into a generally rectangular shape in plane view extending in the lengthwise direction. The wire portion 2 is defined in the suspension board with circuit 1 as a region where the back surface (a lower surface) is mounted on and supported by a load beam, which is not shown.

The mounting portion 3 is, when the wire portion 2 is mounted on the load beam, defined as a region that is exposed from the load beam without being mounted thereon. To be specific, the mounting portion 3 is, in the suspension board with circuit 1, formed as one end portion (the front end portion) in the lengthwise direction on which the slider 39 (the magnetic head 38 mounted on the slider 39 (ref: FIG. 6)) is mounted.

To be specific, the mounting portion 3 is formed to be continuous from the front end of the wire portion 2 and is formed into a generally rectangular shape in plane view protruding toward the both outer sides in a widthwise direction (a direction that is perpendicular to the lengthwise direction) with respect to the wire portion 2.

In the mounting portion 3, a slit 4 in a generally U-shape opening toward the front side in plane view is formed. The mounting portion 3 is divided into a gimbal portion 5 that is sandwiched by the slit 4 in the widthwise direction, outrigger portions 8 that are disposed at the both widthwise outer sides of the slit 4, and a wire folding portion 6 that is disposed at the front side of the gimbal portion 5 and the outrigger portions 8.

The gimbal portion 5 is a portion that gives a degree of freedom in performance to the slider 39 (ref: FIG. 6). The gimbal portion 5 is disposed at the center in the widthwise direction and the center in the front-rear direction of the mounting portion 3, and is formed into a generally rectangular shape in plane view.

In the gimbal portion 5, a slider mounting portion 43 and a head-side terminal forming portion 45 are defined.

The slider mounting portion 43 is a region for mounting the slider 39 (the slider 39 mounted with the magnetic head 38 (ref: FIG. 6)) on the top surface (an upper surface) thereof. The slider mounting portion 43 is disposed at the lengthwise center of the gimbal portion 5 and is defined into a generally rectangular shape in plane view that is long in the widthwise direction.

In the slider mounting portion 43, a penetrating space 25 is formed.

The penetrating space 25 is formed into a long hole shape that is long in the widthwise direction penetrating through the suspension board with circuit 1 in the thickness direction, and is defined to be slightly smaller than the slider mounting portion 43 so as to be overlapped with the slider mounting portion 43 in plane view.

The penetrating space 25 is defined as a long hole that is larger than the light emitting device 40 so as to be capable of allowing the light emitting device 40 to penetrate through in a state where the folded-back portion 10 is folded back.

As shown in FIG. 2, the slider mounting portion 43 is provided with a pedestal 9 on which the slider 39 is placed. The pedestal 9 is formed of an insulating base layer 12 and the insulating cover layer 14 to be described later around the penetrating space 25 in the slider mounting portion 43.

The head-side terminal forming portion 45 is a region where a head-side terminal 16, as a top-surface-side terminal (a second terminal) to be described later, is formed on the top surface (the upper surface) thereof. The head-side terminal forming portion 45 is defined so as to extend in the widthwise direction and is disposed at the front side of the slider mounting portion 43.

In the penetrating space 25, a plurality (two pieces) of the folded-back portions 10 are formed at the inner side thereof.

Each of the folded-back portions 10 is continuous to the slider mounting portion 43 around the penetrating space 25 via a bent portion 18, respectively.

The bent portions 18 are disposed in parallel at spaced intervals to each other in the widthwise direction at the generally widthwise center of the penetrating space 25. The bent portion 18 protrudes into a rectangular shape in plane view from the front end edge of the penetrating space 25 in the slider mounting portion 43 toward the rear side.

The folded-back portions 10 each extend from the bent portion 18 toward the rear side and are disposed in parallel at spaced intervals to each other in the widthwise direction at the generally widthwise center of the penetrating space 25.

The folded-back portion 10 includes an element-side terminal forming portion 46 at the front side thereof and a protruding portion 20 at the rear side thereof.

The element-side terminal forming portion 46 is a region where an element-side terminal 22, as a back-surface-side terminal (a fourth terminal to be described later), is formed on the top surface (the upper side, as referred in FIGS. 4 to 6, when the folded-back portion 10 is folded back, the back surface (the lower surface)). The element-side terminal forming portion 46 is formed into a generally rectangular shape in plane view protruding in the widthwise direction with respect to the bent portion 18.

The element-side terminal forming portion 46 is, in the lengthwise direction, spaced in opposed relation to the head-side terminal forming portion 45. As referred in FIGS. 4 to 6, the element-side terminal forming portion 46 is, when the folded-back portion 10 is folded back, disposed in opposed relation to the head-side terminal forming portion 45 in the thickness direction.

The protruding portion 20 is a region where a first auxiliary pad 33a to be described later is formed on the back surface (the lower side, as referred in FIGS. 4 to 6, when the folded-back portion 10 is folded back, the upper side). In the folded-back portion 10, the protruding portion 20 is formed into a generally rectangular shape in plane view so as to protrude from the element-side terminal forming portion 46 toward the rear side.

In the folded-back portion 10, at the circumference edge thereof, the front end edge (a part of the circumference edge) is continuous to the slider mounting portion 43 around the penetrating space 25 (the suspension board with circuit 1 around the folded-back portion 10) via the bent portion 18. And the circumference edge other than the front end edge (the remaining portion of the circumference edge) is disposed apart from the slider mounting portion 43 around the penetrating space 25 (the suspension board with circuit 1 around the folded-back portion 10) by the penetrating space 25.

In the both widthwise end portions of the bent portion 18, cut-out portions 28 are formed. The cut-out portions 28 are formed by allowing the both widthwise end portions of the bent portion 18 to be cut out into a generally triangular shape in plane view toward the widthwise inner side.

In this way, the bent portion 18 is formed as a weak portion between the slider mounting portion 43 around the penetrating space 25 and the folded-back portion 10. Therefore, the folded-back portion 10 is capable of being folded back toward the back surface side of the suspension board with circuit 1 so that the top surface (the back surface) of the bent portion 18 becomes a mountain (a valley).

The bent portion 18 clearly shows the position thereof by the cut-out portion 28 in the above-described shape, so that a folding-back process (described later) can be performed easily and reliably.

The wire folding portion 6 is, at the front side with respect to the head-side terminal forming portion 45 in the mounting portion 3, defined into a generally rectangular shape in plane view that is long in the widthwise direction.

As shown in FIGS. 1 and 2, the conductive pattern 7 includes a first conductive pattern 13 and a second conductive pattern 19.

The first conductive pattern 13 is formed on the top surface of the metal supporting board 11 and integrally includes an external-side terminal 17 as a first terminal, the head-side terminal 16 as the second terminal, and a signal wire 15 that connects the external-side terminal 17 to the head-side terminal 16.

A plurality (six pieces) of the signal wires 15 are provided along the lengthwise direction and are disposed in parallel at spaced intervals to each other in the widthwise direction.

A plurality of the signal wires 15 are formed of a first signal wire 15a, a second signal wire 15b, a third signal wire 15c, a fourth signal wire 15d, a fifth signal wire 15e, and a sixth signal wire 15f. The first signal wire 15a, the second signal wire 15b, the third signal wire 15c, the fourth signal wire 15d, the fifth signal wire 15e, and the sixth signal wire 15f are sequentially disposed from the widthwise one side toward the widthwise other side.

In the mounting portion 3, the first signal wire 15a, the second signal wire 15b, and the third signal wire 15c (a one-side signal wire 15g) are disposed over the outrigger portion 8 at the widthwise one side and are formed so as to be along the same. Also, the fourth signal wire 15d, the fifth signal wire 15e, and the sixth signal wire 15f (an other-side signal wire 15h) are disposed over the outrigger portion 8 at the widthwise other side and are formed so as to be along the same.

The first signal wire 15a, the second signal wire 15b, the third signal wire 15c, the fourth signal wire 15d, the fifth signal wire 15e, and the sixth signal wire 15f are disposed so as to be folded back in the wire folding portion 6 to reach the head-side terminal forming portion 45. To be specific, each of the signal wires 15 is arranged in the following manner. Each of the signal wires 15 reaches the both widthwise outer side portions of the wire folding portion 6 from the front end of the outrigger portion 8 to be bent. Thereafter, in the wire folding portion 6, each of the signal wires 15 extends toward the widthwise inner side, then is folded back toward the rear side, and extends from the rear end of the wire folding portion 6 toward the rear side to reach the front end portion of the head-side terminal 16 in the head-side terminal forming portion 45.

Of the signal wires 15, the first signal wire 15a and the sixth signal wire 15f, which are at the most outer side, are formed apart from the outer end edge of the metal supporting board 11 by a space where a power source wire 21 to be described later is formed.

A plurality (six pieces) of the external-side terminals 17 are disposed in the rear end portion on the top surface of the wire portion 2 so that the rear end portion of each of the signal wires 15 is connected thereto, respectively. The external-side terminals 17 are disposed at spaced intervals to each other in the widthwise direction. In the external-side terminals 17, a first external-side terminal 17a, a second external-side terminal 17b, a third external-side terminal 17c, a fourth external-side terminal 17d, a fifth external-side terminal 17e, and a sixth external-side terminal 17f, which are respectively connected corresponding to the first signal wire 15a, the second signal wire 15b, the third signal wire 15c, the fourth signal wire 15d, the fifth signal wire 15e, and the sixth signal wire 15f, are sequentially disposed from the widthwise one side toward the widthwise other side.

As shown in FIGS. 5 and 6, an external circuit board 35, as an external circuit, is to be electrically connected to the external-side terminal 17. As the external circuit board 35, for example, a read/write board and the like are used.

The head-side terminal 16 is the top-surface-side terminal that is disposed on the top surface of the mounting portion 3 and to be more specific, is disposed in the head-side terminal forming portion 45 in the gimbal portion 5. A plurality (six pieces) of the head-side terminals 16 are provided so that the front end portion of each of the signal wires 15 is connected thereto, respectively.

To be more specific, the head-side terminals 16 are disposed at spaced intervals to each other in the widthwise direction so as to be along the rear end edge of the head-side terminal forming portion 45 (the front end edge of the slider mounting portion 43).

A plurality of the head-side terminals 16 are formed of a first head-side terminal 16a, a second head-side terminal 16b, a third head-side terminal 16c, a fourth head-side terminal 16d, a fifth head-side terminal 16e, and a sixth head-side terminal 16f. In the head-side terminals 16, the third head-side terminal 16c, the second head-side terminal 16b, and the first head-side terminal 16a (a head-side terminal 16g at one side); and the sixth head-side terminal 16f, the fifth head-side terminal 16e, and the fourth head-side terminal 16d (a head-side terminal 16h at the other side), which are respectively connected corresponding to the third signal wire 15c, the second signal wire 15b, and the first signal wire 15a (the one-side signal wire 15g); and the sixth signal wire 15f, the fifth signal wire 15e, and the fourth signal wire 15d (the other-side signal wire 15h), are sequentially disposed from the widthwise one side toward the widthwise other side.

The head-side terminal 16g at one side and the head-side terminal 16h at the other side are disposed at spaced intervals to each other in the widthwise direction. In the wire folding portion 6, the one-side signal wire 15g and the other-side signal wire 15h are disposed at spaced intervals to each other in the widthwise direction, corresponding to the head-side terminal 16g at one side and the head-side terminal 16h at the other side.

As referred in FIG. 6, the magnetic head 38 is to be electrically connected to the head-side terminal 16 via a solder ball 26.

In the first conductive pattern 13, a write signal that is transmitted from the external circuit board 35 is entered into the magnetic head 38 of the slider 39 via the external-side terminal 17, the signal wire 15, and the head-side terminal 16. Also, a read signal that is read with the magnetic head 38 is entered into the external circuit board 35 via the head-side terminal 16, the signal wire 15, and the external-side terminal 17.

The second conductive pattern 19 is formed on the top surface of the metal supporting board 11, and includes a supply-side terminal 23 as a third terminal, the element-side terminal 22 as the fourth terminal, and the power source wire 21 for connecting the supply-side terminal 23 to the element-side terminal 22

A plurality (two pieces) of the power source wires 21 are provided along the lengthwise direction and are disposed in parallel at spaced intervals to each other in the widthwise direction.

To be more specific, a plurality of the power source wires 21 are formed of a first power source wire 21a and a second power source wire 21b. The first power source wire 21a and the second power source wire 21b are disposed at spaced intervals to each other in the widthwise direction.

The first power source wire 21a that is disposed at the widthwise one side and the second power source wire 21b that is disposed at the widthwise other side are disposed apart from each other in the widthwise direction by a space where the signal wire 15 is formed.

That is, in the wire portion 2, the first power source wire 21a is disposed at the widthwise one side (the outer side) of the first signal wire 15a and the second power source wire 21b is disposed at the widthwise other side (the outer side) of the sixth signal wire 15f.

Also, the first power source wire 21a and the second power source wire 21b are arranged in the following manner. In the outrigger portion 8, the first power source wire 21a and the second power source wire 21b extend along the first signal wire 15a and the sixth signal wire 15f, respectively; in the wire folding portion 6, extend toward the widthwise inner side; and then are folded back toward the rear side. The first power source wire 21a and the second power source wire 21b extend toward the rear side between the one-side signal wire 15g and the other-side signal wire 15h, pass through between the head-side terminal 16g at one side and the head-side terminal 16h at the other side, and further pass through each of the bent portions 18 to reach the front end portion of the element-side terminal 22 in the element-side terminal forming portion 46.

A plurality (two pieces) of the supply-side terminals 23 are disposed in the rear end portion on the top surface of the wire portion 2 so that the rear end portion of each of the power source wires 21 is connected thereto, respectively. The supply-side terminals 23 are formed of a first supply-side terminal 23a and a second supply-side terminal 23b, which are connected corresponding to the first power source wire 21a and the second power source wire 21b. The first supply-side terminal 23a and the second supply-side terminal 23b are disposed at spaced intervals to each other in the widthwise direction.

The first supply-side terminal 23a that is disposed at the widthwise one side and the second supply-side terminal 23b that is disposed at the widthwise other side are disposed apart from each other in the widthwise direction by a space where the external-side terminal 17 is formed.

The supply-side terminal 23 is, when projected in the widthwise direction, formed so as to be disposed at the same position as the external-side terminal 17. A power source (not shown), as an external circuit, is to be electrically connected to the supply-side terminal 23.

The element-side terminal 22 is formed on the top surface of the folded-back portion 10. As referred in FIGS. 5 and 6, the element-side terminal 22 is, in a state where the folded-back portion 10 is folded back, the back-surface-side terminal that is disposed at the back surface side of the suspension board with circuit 1 and is provided in the element-side terminal forming portion 46.

A plurality (two pieces) of the element-side terminals 22 are provided so that the front end portion of each of the power source wires 21 is connected thereto, respectively. The element-side terminals 22 are formed of a first element-side terminal 22a and a second element-side terminal 22b, which are respectively connected corresponding to the first power source wire 21a and the second power source wire 21b. The first element-side terminal 22a and the second element-side terminal 22b are, in the corresponding element-side terminal forming portion 46, disposed at spaced intervals to each other in the widthwise direction.

The element-side terminal 22 is disposed in opposed relation to the head-side terminal 16 in the lengthwise direction. As referred in FIGS. 4 to 6, when the folded-back portion 10 is folded back, the element-side terminal 22 is disposed in opposed relation to the head-side terminal 16 in a thickness direction.

That is, in the suspension board with circuit 1, as referred in FIGS. 4 to 6, in a state where the folded-back portion 10 is folded back, the slider 39 is capable of being opposed to the light emitting device 40, and the head-side terminal 16 and the element-side terminal 22 are disposed so that the slider 39 (the magnetic head 38 mounted on the slider 39) is capable of being connected to the head-side terminal 16 (the top-surface-side terminal, the second terminal) and the light emitting device 40 is capable of being connected to the element-side terminal 22 (the back-surface-side terminal, the fourth terminal).

As shown in FIG. 6, the light emitting device 40 is to be electrically connected to the element-side terminal 22 via a wire 41.

The second conductive pattern 19 further includes the first auxiliary pads 33a in each of the folded-back portions 10 and includes second auxiliary pads 33b in the middle of each of the power source wires 21. Each of the first auxiliary pads 33a and each of the second auxiliary pads 33b form a pair, respectively.

The first auxiliary pads 33a are formed into a generally rectangular shape in plane view in the protruding portion 20 in each of the folded-back portions 10 (at the back surface side). In each of the folded-back portions 10, each of the first auxiliary pads 33a is connected to the element-side terminal 22 via the power source wire 21.

The second auxiliary pad 33b is formed into a generally rectangular shape in plane view, which is generally the same as the first auxiliary pad 33a or is slightly larger than that, in the wire folding portion 6 (at the back surface side). The second auxiliary pad 33b is disposed in opposed relation to the first auxiliary pad 33a in the lengthwise direction.

As referred in FIGS. 5 and 6, a pair of auxiliary pads 33 consisting of the first auxiliary pad 33a and the second auxiliary pad 33b are, in a state where the folded-back portion 10 is folded back, disposed in opposed relation so as to be in contact with each other in the thickness direction of the suspension board with circuit 1.

As described later, the first auxiliary pad 33a and the second auxiliary pad 33b (hereinafter referred as the auxiliary pad 33 when collectively referred) are connected by, for example, ultrasonic bonding, solder bonding, and the like. In this way, the folded-back portion 10 is capable of being fixed to the back surface of the suspension board with circuit 1.

In the second conductive pattern 19, the light emitting device 40 is activated by supplying electrical energy supplied from the power source with the light emitting device 40 via the supply-side terminal 23, the power source wire 21, and the element-side terminal 22.

As shown in FIG. 2, the suspension board with circuit 1 includes the metal supporting board 11, the insulating base layer 12 that is formed on the top surface of the metal supporting board 11, the conductive pattern 7 that is formed on the top surface of the insulating base layer 12, and the insulating cover layer 14 that is formed on the top surface of the insulating base layer 12 so as to cover the conductive pattern 7.

The metal supporting board 11 forms an outer shape of the suspension board with circuit 1 and at the inner side thereof, is formed in a region except for the region where the slit 4, the slider mounting portion 43, and the head-side terminal forming portion 45 are formed.

The metal supporting board 11 is formed of a metal material such as stainless steel, 42-alloy, aluminum, copper-beryllium, and phosphor bronze. Preferably, the metal supporting board 11 is formed of stainless steel. The metal supporting board 11 has a thickness in the range of, for example, 15 to 50 μm, or preferably 15 to 20 μm.

The insulating base layer 12 is formed in a portion where the conductive pattern 7 is formed (except for the region where the auxiliary pad 33 is formed) and is formed in a portion where the pedestal 9 is formed.

To be specific, in the gimbal portion 5, the insulating base layer 12 is formed on the entire surface of the head-side terminal forming portion 45 except for the region where the auxiliary pad 33 is formed and on the entire surface of the slider mounting portion 43 except for the region where the penetrating space 25 is formed (including the folded-back portion 10).

The insulating base layer 12 is formed of an insulating material such as a synthetic resin including polyimide resin, polyamide imide resin, acrylic resin, polyether nitrile resin, polyether sulfone resin, polyethylene terephthalate resin, polyethylene naphthalate resin, and polyvinyl chloride resin. Preferably, the insulating base layer 12 is formed of polyimide resin.

The insulating base layer 12 has a thickness in the range of, for example, 1 to 35 µm, or preferably 8 to 15 µm.

The conductive pattern 7 is formed of a conductive material such as copper, nickel, gold, solder, or alloys thereof. Preferably, the conductive pattern 7 is formed of copper.

The conductive pattern 7 has a thickness in the range of, for example, 3 to 50 µm, or preferably 5 to 20 µm.

Each of the signal wires 15 and each of the power source wires 21 have a width in the range of, for example, 5 to 200 µm, or preferably 8 to 100 µm. A space between the signal wires 15, and a space between the signal wire 15 and the power source wire 21 (a space between the first signal wire 15a and the first power source wire 21a, and a space between the sixth signal wire 15f and the second power source wire 21b) are in the range of, for example, 5 to 1000 µm, or preferably 8 to 100 µm.

Each of the external-side terminals 17, each of the head-side terminals 16, each of the supply-side terminals 23, and each of the element-side terminals 22 have a width in the range of, for example, 20 to 1000 µm, or preferably 30 to 800 µm. A space between the external-side terminals 17, a space between the head-side terminals 16, a space between the external-side terminal 17 and the supply-side terminal 23 (a space between the first external-side terminal 17a and the first supply-side terminal 23a, and a space between the sixth external-side terminal 17f and the second supply-side terminal 23b) are in the range of, for example, 20 to 1000 µm, or preferably 30 to 800 µm.

Each of the auxiliary pads 33 has a width in the range of, for example, 20 to 1000 µm, or preferably 30 to 800 µm. A space between the first auxiliary pads 33a and a space between the second auxiliary pads 33b are in the range of, for example, 20 to 1000 µm, or preferably 30 to 800 µm.

The insulating cover layer 14 is formed in a portion where the insulating base layer 12 is formed (except for the region where the external-side terminal 17, the supply-side terminal 23, the head-side terminal 16, and the element-side terminal 22 are formed) and is formed in a portion where the pedestal 9 is formed.

To be specific, in the gimbal portion 5, the insulating cover layer 14 is not formed in the slider mounting portion 43 except for the region where the pedestal 9 is formed (including the folded-back portion 10) and in the head-side terminal forming portion 45, and is formed in a portion where the insulating base layer 12 is formed (except for the above-described terminals), other than the portions described above.

To be specific, the insulating cover layer 14 is formed into a pattern of exposing the external-side terminal 17 and the head-side terminal 16 (not shown in FIG. 2) and covering the signal wire 15, corresponding to the first conductive pattern 13. The insulating cover layer 14 is also formed into a pattern of exposing the supply-side terminal 23 (not shown in FIG. 2) and the element-side terminal 22 and covering the power source wire 21, corresponding to the second conductive pattern 19.

The insulating cover layer 14 is formed of the same insulating material as that of the above-described insulating base layer 12. The insulating cover layer 14 has a thickness in the range of, for example, 1 to 40 µm, or preferably 1 to 10 µm.

Next, a method for producing the suspension board with circuit 1 is described with reference to FIG. 3.

In this method, as shown in FIG. 3 (a), the metal supporting board 11 is first prepared.

Next, as shown in FIG. 3 (b), a varnish of a photosensitive insulating material is applied onto the top surface of the metal supporting board 11 and is then dried. Thereafter, the dried varnish is exposed to light and is then developed to be heat cured, so that the insulating base layer 12 is formed in the region where the conductive pattern 7 is formed, except for the auxiliary pad 33, in the head-side terminal forming portion 45, and in the slider mounting portion 43 with the above-described pattern.

Next, as shown in FIG. 3 (c), the conductive pattern 7 is formed on the top surface of the insulating base layer 12 by an additive method, a subtractive method, or the like. In this way, the conductive pattern 7 is formed on the top surface of the insulating base layer 12, except for the auxiliary pad 33, and the auxiliary pad 33 is formed on the top surface of the metal supporting board 11 at the inner side of the insulating base layer 12.

Next, as shown in FIG. 3 (d), a varnish of a photosensitive insulating material is applied onto the top surface of the insulating base layer 12 so as to cover the conductive pattern 7 and is then dried. Thereafter, the dried varnish is exposed to light and is then developed to be heat cured, so that the insulating cover layer 14 is formed in the region where the conductive pattern 7 is formed, except for each of the terminals, and in the slider mounting portion 43 with the above-described pattern.

Subsequently, as shown in FIG. 3 (e), the regions in the metal supporting board 11 corresponding to the slit 4, the slider mounting portion 43, and the head-side terminal forming portion 45 are removed to form the slit 4 and the penetrating space 25, and the auxiliary pad 33 is exposed from the back surface of the metal supporting board 11. At the same time with this, the outer shape of the metal supporting board 11 is cut out, so that the suspension board with circuit 1 integrally including the folded-back portion 10 is obtained.

In the removal of the metal supporting board 11, for example, an etching method such as a dry etching (for example, a plasma etching) or a wet etching (for example, a chemical etching), for example, a drilling and boring, a laser processing, or the like is used. Preferably, the wet etching is used.

The suspension board with circuit 1 is formed as a suspension board with circuit assembly sheet in which the insulating base layer 12, the conductive pattern 7, and the insulating cover layer 14 are laminated on one piece of the metal supporting board 11, and a plurality of the suspension boards with circuits 1 are formed.

As referred in FIGS. 4 to 6, in the suspension board with circuit 1 that is obtained in this way, at the time of its use, the folded-back portion 10 is folded back, the magnetic head 38 is mounted on the top surface side thereof, and the light emitting device 40 is mounted on the back surface side thereof.

To be specific, at the time of use of the suspension board with circuit 1, the folded-back portion 10 is folded back so as to be opposed to the back surface of the head-side terminal forming portion 45 (the slider mounting portion 43 around the penetrating space 25) in the gimbal portion 5 (the folding-back process).

That is, the folded-back portion 10 is folded back toward the back surface side so that the back surface of the insulating base layer 12 in the folded-back portion 10 and that of the insulating base layer 12 in the head-side terminal forming portion 45 are disposed to be adjacent to each other in the thickness direction.

In the folding-back process, the folded-back portion 10 is folded back so that the top surface (the back surface) of the bent portion 18 becomes a mountain (a valley), and the back surface of the first auxiliary pad 33a in the folded-back portion 10 and that of the second auxiliary pad 33b in the wire folding portion 6 are in contact with each other.

Next, the first auxiliary pad 33a and the second auxiliary pad 33b, which are in contact with each other, are connected by, for example, the ultrasonic bonding (an ultrasonic welding), or the like (a bonding process).

In the bonding, bonding conditions, such as an ultrasonic frequency, are set appropriately according to quality of material and the like of the auxiliary pad 33.

Thereafter, the slider 39 mounted with the light emitting device 40 on the back surface thereof is mounted on the slider mounting portion 43 via an adhesive (not shown) so that the light emitting device 40 is allowed to penetrate through the penetrating space 25. To be specific, the slider 39 is mounted on the slider mounting portion 43 so as to cover the penetrating space 25 from above via the adhesive (not shown), which is disposed around the penetrating space 25, to be specific, disposed on the pedestal 9. Then, the light emitting device 40 is allowed to penetrate through the penetrating space 25.

In this way, the mounted slider 39 is disposed on the top surface side of the suspension board with circuit 1, which is in a state where the folded-back portion 10 is folded back.

The light emitting device 40 mounted on the slider 39 is disposed on the back surface side of the suspension board with circuit 1, which is in a state where the folded-back portion 10 is folded back.

When the suspension board with circuit 1 is used in the hard disk drive, the slider 39 is disposed on the slider mounting portion 43 so as to travel relatively with respect to a magnetic disk 32 (ref: phantom lines in FIG. 6) and to be floated at minute spaced intervals thereto. As shown in FIG. 6, the magnetic head 38, an optical waveguide 31, and a near-field light generation member 34 are mounted on the slider 39.

The magnetic head 38 is mounted on the top surface of the slider 39 and is provided so as to be opposed to the magnetic disk 32, which is shown in the phantom lines in FIG. 6, and so that information can be read from and written to the magnetic disk 32.

The optical waveguide 31 is provided so as to allow light emitted from the light emitting device 40 to be described next to enter the near-field light generation member 34 and is formed so as to extend along the thickness direction. The near-field light generation member 34 is provided at the upper end of the optical waveguide 31.

The near-field light generation member 34 is provided in order to allow near-filed light to generate from the light that is entered from the optical waveguide 31 and then apply the near-field light onto the magnetic disk 32 so as to heat a minute region on the magnetic disk 32. The near-field light generation member 34 is made of a metal scatterer, an opening, or the like, and a known near-field light generating device described in, for example, Japanese Unexamined Patent Publications No. 2007-280572, No. 2007-052918, No. 2007-207349, No. 2008-130106, or the like is used.

The light emitting device 40 is a light source for allowing light to enter the optical waveguide 31. The light emitting device 40 is, for example, the light source that converts electrical energy into light energy to emit high energy light from an emission port.

The light emitting device 40 is mounted on the back surface of the slider 39 so as to be allowed to penetrate through the penetrating space 25 in the metal supporting board 11. The light emitting device 40 is mounted on the slider 39 so that the emission port thereof is opposed to the optical waveguide 31.

In the suspension board with circuit 1, the magnetic head 38 is electrically connected to the head-side terminal 16 via the solder ball 26 and the external circuit board 35 is connected to the external-side terminal 17. Subsequently, the light emitting device 40 is electrically connected to the element-side terminal 22 via the wire 41. The power source (not shown) is electrically connected to the supply-side terminal 23.

In this way, the slider 39 mounted with the magnetic head 38 and the light emitting device 40 can be mounted on the suspension board with circuit 1.

Thereafter, in the hard disk drive, the back surface of the wire portion 2 is mounted on the top surface of the load beam, so that the wire portion 2 is supported.

In the hard disk drive on which the suspension board with circuit 1 is mounted, an optical assist system can be used.

To be specific, in the hard disk drive, the magnetic disk 32, which is shown in the phantom lines in FIG. 6, travels relatively with respect to the near-field light generation member 34 and the magnetic head 38. The light emitted from the light emitting device 40 passes through the optical waveguide 31 to reach the near-field light generation member 34. The near-field light generated by the near-field light generation member 34 is applied onto the top surface of the magnetic disk 32 that is opposed to the upper side of the near-field light generation member 34. Then, the top surface of the magnetic disk 32 is heated by the irradiation of the near-field light from the near-field light generation member 34 and in this state, information is recorded on the magnetic disk 32 by the irradiation of the magnetic field from the magnetic head 38. In this way, the coercive force of the magnetic disk 32 is reduced, so that the information can be recorded onto the magnetic disk 32 with high density by the irradiation of the small magnetic field.

In the suspension board with circuit 1, at the circumference edge of the folded-back portion 10 that is capable of being folded back, the front end edge (a part of the circumference edge) is continuous to the slider mounting portion 43 around the penetrating space 25 (the suspension board with circuit 1 around the folded-back portion 10) via the bent portion 18, and the circumference edge other than the front end edge (the remaining portion of the circumference edge) is disposed apart from the slider mounting portion 43 around the penetrating space 25 (the suspension board with circuit 1 around the folded-back portion 10) by the penetrating space 25.

That is, the folded-back portion 10 is formed at the inner side of the suspension board with circuit 1. Therefore, it is possible to dispose the terminals (the head-side terminal 16, the external-side terminal 17, the element-side terminal 22, the supply-side terminal 23, and the like) on the top surface side and the back surface side of the suspension board with circuit 1 in a dispersed manner to reduce the wiring density and achieve miniaturization. In addition, when produced as an assembly sheet, the suspension board with circuit 1 can be efficiently produced in a space saving manner.

In the suspension board with circuit 1, the head-side terminal 16 that is to be electrically connected to the magnetic head 38 is disposed on the top surface of the suspension board with circuit 1 and the element-side terminal 22 that is to be electrically connected to the light emitting device 40 is disposed on the back surface of the suspension board with circuit 1, so that the terminals can be formed with a low arrangement density. In this way, a short circuit thereof can be prevented. As a result, connecting reliability of the conductive pattern 7 can be improved.

In the suspension board with circuit 1, the light emitted from the light emitting device 40 enters the optical waveguide 31 of the slider 39, so that the optical assist system can be efficiently performed due to the heating by the near-field light that is converted from the light in the optical waveguide 31, and the magnetic field of the magnetic head 38.

When the light emitting device 40 and the slider 39 are spaced apart from each other at a large interval, there may be a case where a function of the light emitting device 40 cannot be fully developed. However, in the suspension board with circuit 1, the light emitting device 40 and the slider 39 are disposed in opposed relation to each other in the thickness direction, so that the light emitting device 40 can be disposed in the neighborhood of the slider 39 and therefore, the light emitting device 40 can be efficiently operated.

In the suspension board with circuit 1, the light emitting device 40 is allowed to penetrate through the penetrating space 25 to be mounted thereon, so that it is possible to achieve a thinner suspension board with circuit 1.

In addition, in the suspension board with circuit 1, the auxiliary pad 33 is subjected to the ultrasonic bonding, so that the folded-back portion 10 can be reliably fixed to the back surface side of the suspension board with circuit 1.

In the suspension board with circuit 1, though not shown, the supply-side terminal 23 can be provided in the folded-back portion 10. In that case, the power source wire 21 is disposed in the folded-back portion 10.

FIG. 7 shows an enlarged plan view of an essential part of another embodiment of the suspension board with circuit:

(a) illustrating an embodiment in which an auxiliary pad is formed as a back surface of an element-side terminal and (b) illustrating an embodiment in which the auxiliary pad is formed as the back surface of the conductive pattern and the element-side terminal. In each figure to be described below, the same reference numerals are provided for members corresponding to each of those described above, and their detailed description is omitted.

In the above-described description, the protruding portion 20 is provided in the folded-back portion 10 and the first auxiliary pad 33a is disposed in the protruding portion 20 in the folded-back portion 10. Alternatively, for example, as shown in FIG. 7 (a), the first auxiliary pad 33a can be formed as the back surface of the element-side terminal 22.

In that case, though not shown, the top surface of the element-side terminal 22 is exposed from the insulating cover layer 14 and a part of the back surface thereof is exposed, as the first auxiliary pad 33a, from the insulating base layer 12.

In this case, in the same manner as described above, the second auxiliary pad 33b is formed into a generally rectangular shape in plane view, which is generally the same as the first auxiliary pad 33a or slightly larger than the first auxiliary pad 33a, in the middle of the power source wire 21 (on the back surface side), and is disposed in opposed relation to the first auxiliary pad 33a in the lengthwise direction.

In the embodiment, in the same manner as described above, the auxiliary pad 33 is subjected to the ultrasonic bonding, so that the folded-back portion 10 can be reliably fixed to the back surface side of the suspension board with circuit 1.

As shown in FIG. 7 (b), it is possible that the first auxiliary pad 33a is formed as the back surface of the element-side terminal 22, and the second auxiliary pad 33b is formed in the middle of the power source wire 21 (on the back surface side) and is further formed as the back surface of the head-side terminal 16.

In that case, the top surface of the element-side terminal 22 is exposed from the insulating cover layer 14 and a part of the back surface thereof, as a plurality (two pieces) of the first auxiliary pads 33a, in each of the element-side terminals 22, is exposed from the insulating base layer 12.

Also, in the same manner as described above, the second auxiliary pad 33b is formed in the middle of the power source wire 21 (on the back surface side) and is further formed, for example, as the back surface of the head-side terminal 16 at the widthwise most inner side (the first head-side terminal 16a and the sixth head-side terminal 16f. And each of the second auxiliary pads 33b is disposed in opposed relation to the first auxiliary pad 33a so as to sandwich the slider mounting portion 43 around the penetrating space 25 with the first auxiliary pad 33a.

In this case, the head-side terminal 16 at the widthwise most inner side (the first head-side terminal 16a and the sixth head-side terminal 16f on which the second auxiliary pad 33b is formed and the signal wire 15 (the first signal wire 15a and the sixth signal wire 15f to be connected thereto are formed, for example, as a wire and a terminal (a dummy wire and a dummy terminal), which does not transmit an electrical signal.

Also, in the embodiment, in the same manner as described above, the auxiliary pad 33 is subjected to the ultrasonic bonding, so that the folded-back portion 10 can be reliably fixed to the back surface side of the suspension board with circuit 1.

Figure 8:
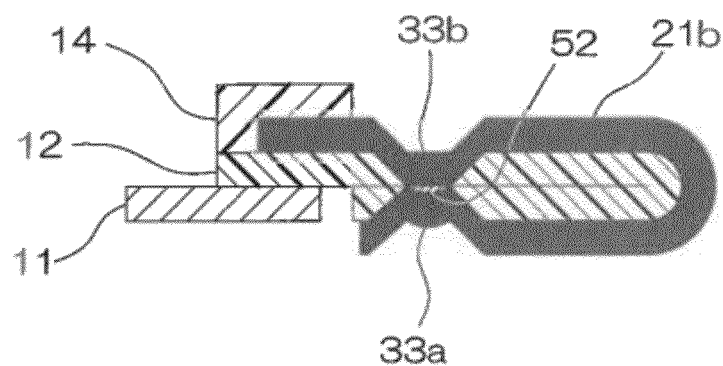
FIG. 8 shows an enlarged sectional view of an essential part of another embodiment (an embodiment in which the auxiliary pads are capable of being solder connected) of the suspension board with circuit of the present invention.

FIG. 8 shows an enlarged sectional view of an essential part of another embodiment (an embodiment in which the auxiliary pads are capable of being solder connected) of the suspension board with circuit of the present invention.

In the above-described description, the auxiliary pad 33 is subjected to the ultrasonic bonding. Alternatively, for example, as shown in FIG. 8, a solder 52 is disposed between the first auxiliary pad 33a and the second auxiliary pad 33b, so that the first auxiliary pad 33a can be solder connected to the second auxiliary pad 33b.

In this case, bonding conditions, such as quality of material and heating condition of the solder 52, are set appropriately according to quality of material and the like of the auxiliary pad 33.

In the suspension board with circuit 1, the auxiliary pad 33 is subjected to the solder bonding, so that the folded-back portion 10 can be reliably fixed to the back surface side of the suspension board with circuit 1.

Figure 9:
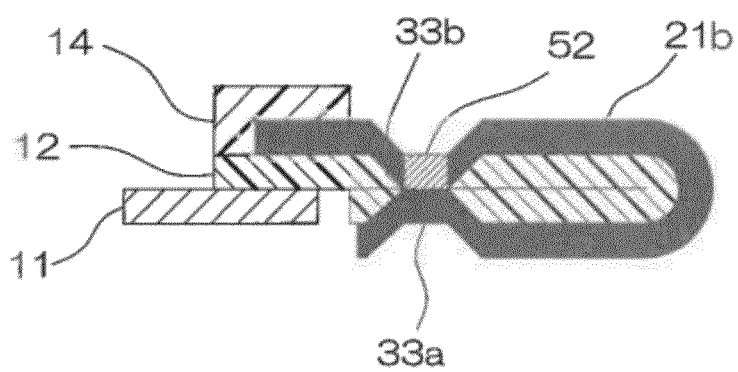
FIG. 9 shows an enlarged sectional view of an essential part of another embodiment (an embodiment in which a penetrating hole capable of being filled with solder is formed in the auxiliary pad) of the suspension board with circuit of the present invention.

FIG. 9 shows an enlarged sectional view of an essential part of another embodiment (an embodiment in which a penetrating hole capable of being filled with solder is formed in the auxiliary pad) of the suspension board with circuit of the present invention.

In the above-described description, the solder 52 is provided between the first auxiliary pad 33a and the second auxiliary pad 33b. Alternatively, for example, as shown in FIG. 9, a penetrating hole 51 that is capable of being filled with the solder 52 is formed in one of either the first auxiliary pad 33a or the second auxiliary pad 33b, for example, in the second auxiliary pad 33b, and the solder 52 is filled in the penetrating hole 51, so that the auxiliary pads 33 can be connected to each other.

In the suspension board with circuit 1, the solder 52 is filled in the penetrating hole 51, so that the auxiliary pad 33 is subjected to the solder bonding further reliably and therefore, the folded-back portion 10 can be reliably fixed to the back surface side of the suspension board with circuit 1.

Figure 10:
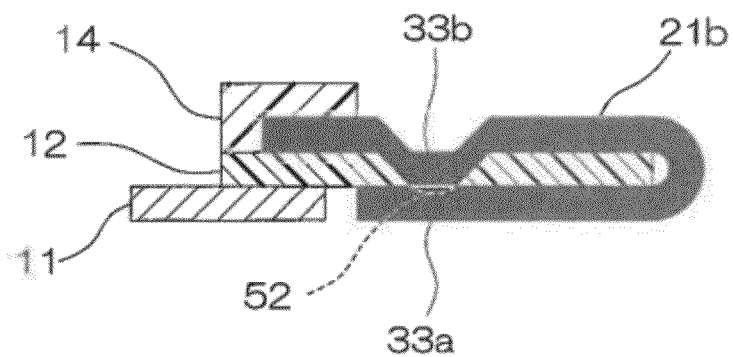
FIG. 10 shows an enlarged sectional view of an essential part of another embodiment (an embodiment in which the auxiliary pad is provided as a flying lead) of the suspension board with circuit of the present invention.

FIG. 10 shows an enlarged sectional view of an essential part of another embodiment (an embodiment in which the auxiliary pad is provided as a flying lead) of the suspension board with circuit of the present invention.

In the above-described description, the protruding portion 20 is provided in the folded-back portion 10 and the first auxiliary pad 33a is disposed in the protruding portion 20 in the folded-back portion 10. Alternatively, for example, as shown in FIG. 10, the first auxiliary pad 33a can be provided as the flying lead by a known method without forming the insulating base layer 12 and the insulating cover layer 14 in the protruding portion 20.

In that case, in the same manner as described above, the first auxiliary pad 33a (the flying lead) can be connected to the second auxiliary pad 33b by the ultrasonic bonding. Furthermore, as shown in the phantom lines in FIG. 10, the solder 52 is provided between the first auxiliary pad 33a and the second auxiliary pad 33b, and the first auxiliary pad 33a can be solder connected to the second auxiliary pad 33b.

In the suspension board with circuit 1, the first auxiliary pad 33a is formed as the flying lead, so that the insulating base layer 12 and the insulating cover layer 14 in the protruding portion 20 can be omitted and therefore, it is possible to achieve a thinner suspension board with circuit 1.

Figure 11:
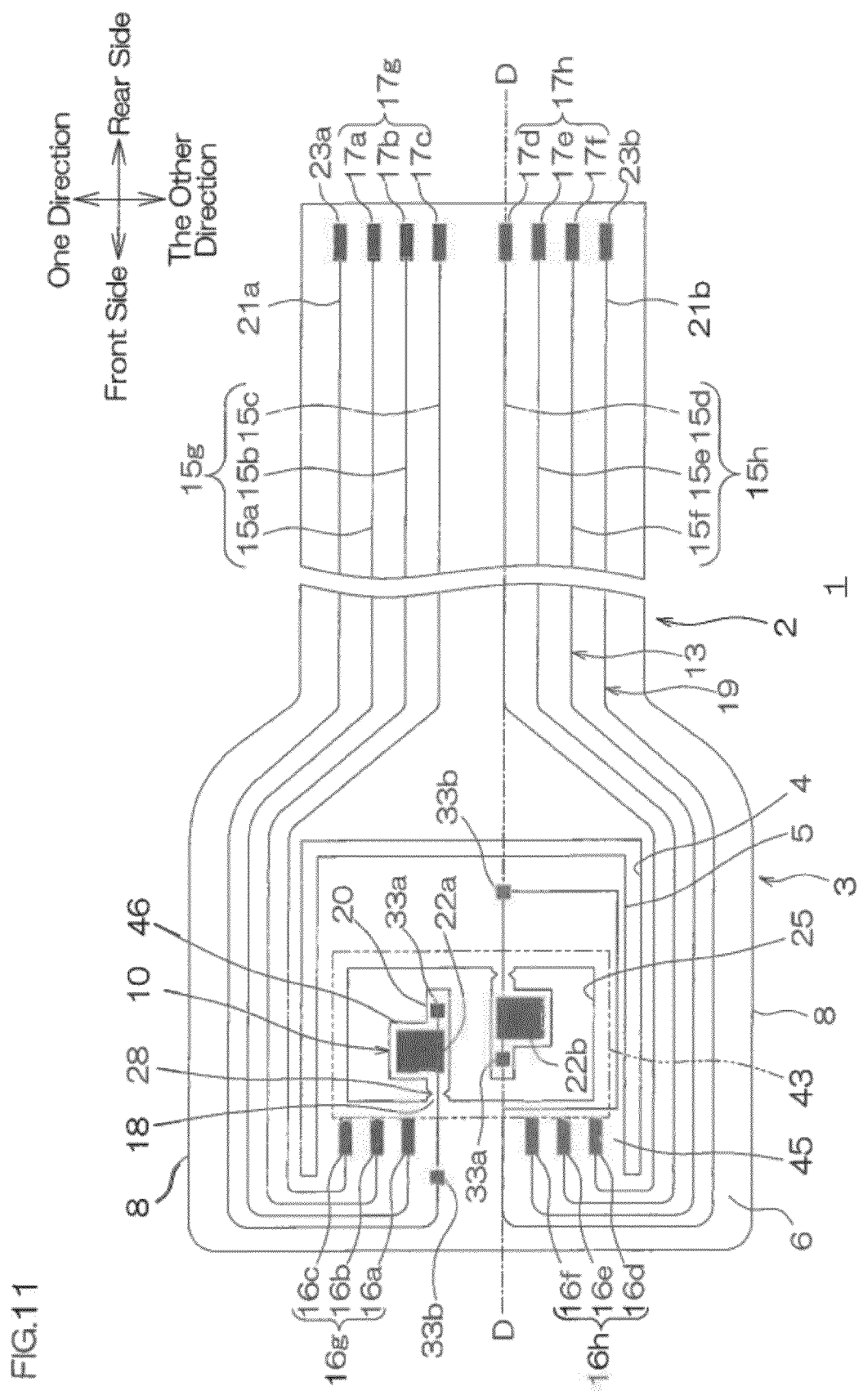
FIG. 11 shows a plan view of another embodiment (an embodiment in which the element-side terminal is disposed so as to sandwich a penetrating space) of the suspension board with circuit of the present invention.
Figure 12:
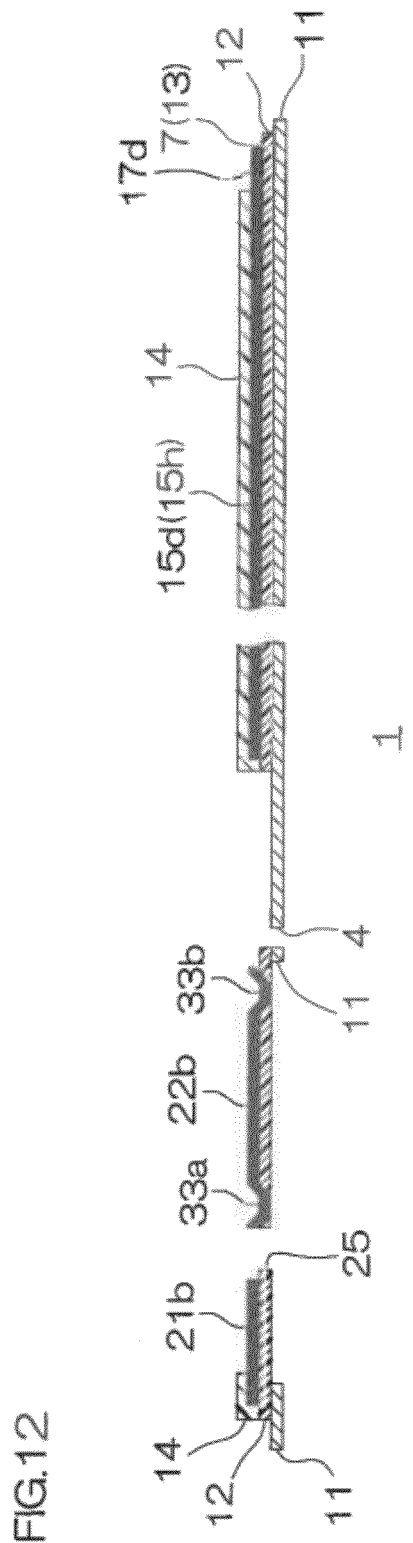
FIG. 12 shows a sectional view, taken along the line D-D of the suspension board with circuit in FIG. 11.
Figure 13:
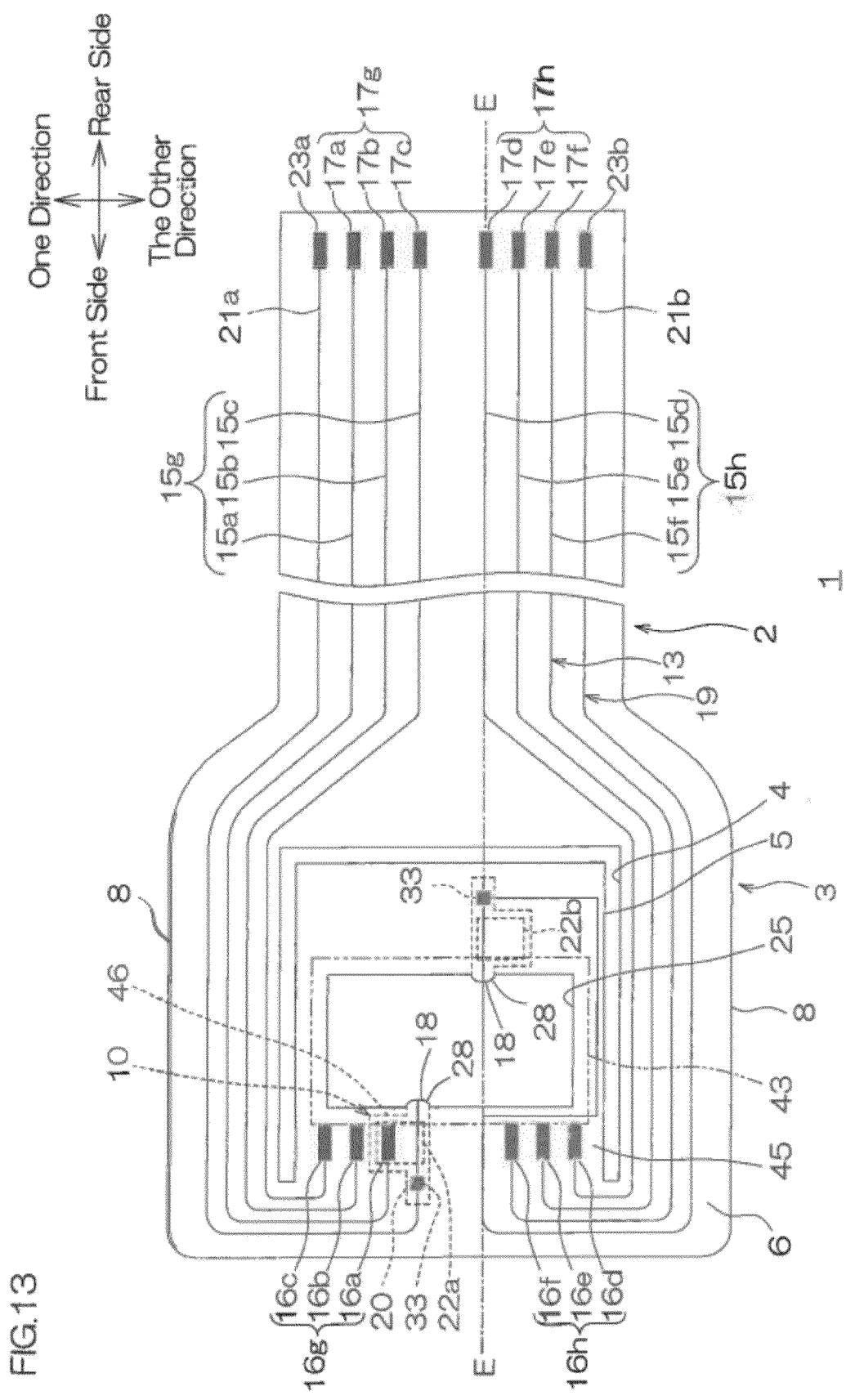
FIG. 13 shows a plan view illustrating a state where the folded-back portion is folded back in the suspension board with circuit in FIG. 11.
Figure 14:
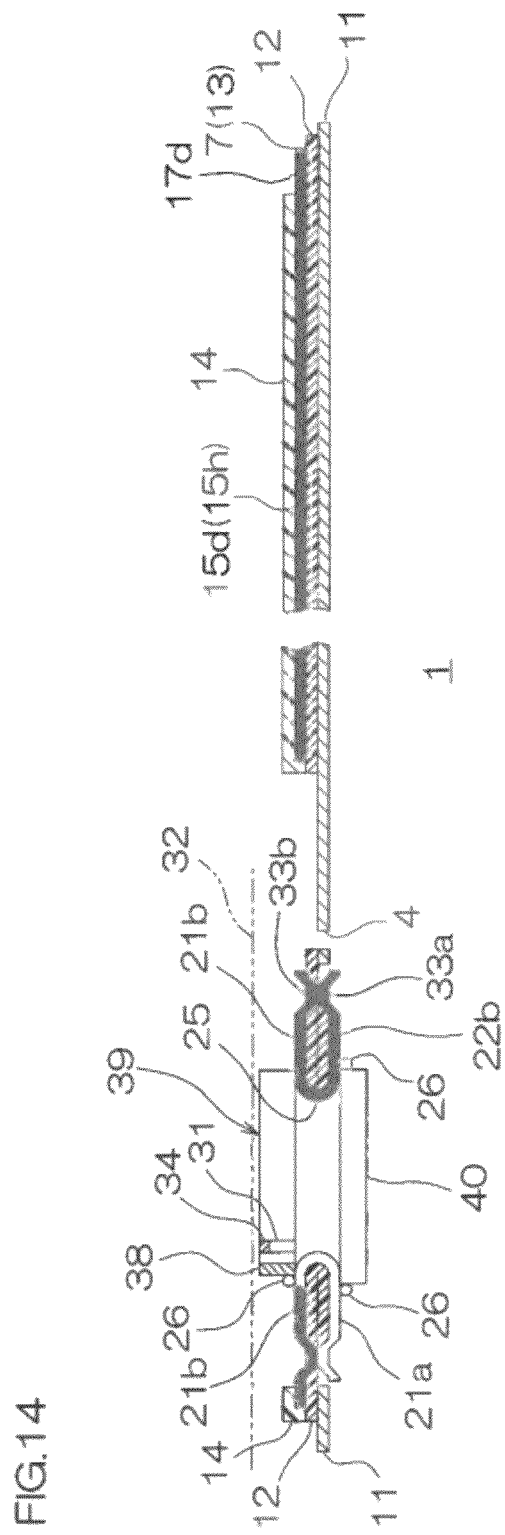
FIG. 14 shows a sectional view, taken along the line E-E of the suspension board with circuit in FIG. 13.

FIG. 11 shows a plan view of another embodiment (an embodiment in which the element-side terminal is disposed so as to sandwich a penetrating space) of the suspension board with circuit of the present invention. FIG. 12 shows a sectional view, taken along the line D-D of the suspension board with circuit in FIG. 11. FIGS. 13 and 14 illustrate a state where the folded-back portion is folded back in the suspension board with circuit in FIG. 11: FIG. 13 showing a plan view and FIG. 14 showing a sectional view, taken along the line E-E of the suspension board with circuit in FIG. 13.

In the above-described description, both of a plurality (two pieces) of the folded-back portions 10 and a plurality (two pieces) of the element-side terminals 22 are disposed at one side (the front side) of the penetrating space 25. Alternatively, for example, as shown in FIG. 11, it is possible that at least one pair (two pieces) of the folded-back portions 10 and the element-side terminals 22 are provided, and the folded-back portion 10 and the element-side terminal 22 at one side are disposed at the front side of the penetrating space 25 and the folded-back portion 10 and the element-side terminal 22 at the other side are disposed at the rear side thereof.

That is, in the suspension board with circuit 1, in a state where the folded-back portion 10 is folded back, one pair of the folded-back portions 10 and the element-side terminals 22 can be disposed so as to sandwich the penetrating space 25.

To be more specific, in the embodiment, a plurality (two pieces) of the folded-back portions 10 form a pair and each thereof is formed at the front side and the rear side in the penetrating space 25, respectively.

On the top surface (the upper side, as referred in FIGS. 13 and 14, when the folded-back portion 10 is folded back, the back surface (the lower surface)) of the folded-back portion 10, the element-side terminals 22 are formed. The element-side terminals 22 form a pair.

In the suspension board with circuit 1, as referred in FIGS. 13 and 14, the element-side terminal 22 connected to the light emitting device 40 is disposed so as to sandwich the penetrating space 25 in a state where the folded-back portion 10 is folded back. In this way, the light emitting device 40 is capable of being disposed so as to cross over the penetrating space 25.

In the embodiment, the light emitting device 40 is provided as a different piece from the slider 39 and is disposed in opposed relation to the slider 39 so as to sandwich the penetrating space 25 with the slider 39.

The penetrating space 25 is, in a state where the folded-back portion 10 is folded back, disposed so that the light emitted from the light emitting device 40 passes through to enter the optical waveguide 31.

In the suspension board with circuit 1, the element-side terminals 22 to be electrically connected to the light emitting device 40 are disposed so as to sandwich the penetrating space 25, so that the light emitting device 40 can be connected to the conductive pattern 7 in two directions.

Therefore, the element-side terminal 22 connecting the light emitting device 40 to the conductive pattern 7 can be disposed in a dispersed manner, so that the wiring density can be reduced and therefore, the short circuit can be prevented and the connecting reliability can be improved, compared to the case where the light emitting device 40 is connected to the conductive pattern 7 in one direction.

In the suspension board with circuit 1, the light emitting device 40 is disposed so as to cross over the penetrating space 25, so that the light emitting device 40 is provided so as to be spaced apart from the slider 39 at a predetermined interval and therefore, the short circuit of the conductive pattern 7 and the like can be prevented.

Figure 15:
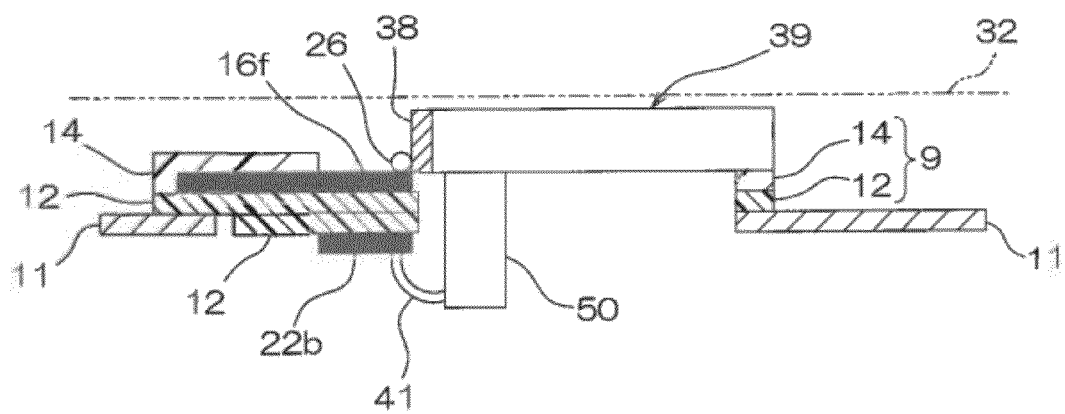
FIG. 15 shows a sectional view of an essential part illustrating a state where the folded-back portion is folded back of another embodiment (an embodiment in which an inspecting device is used as an electronic device) of the suspension board with circuit of the present invention.

In addition, in the suspension board with circuit 1, in a case of being mounted with the light emitting device 40, the light emitted from the light emitting device 40 passes through the penetrating space 25, so that the light is not blocked and therefore, the optical assist system can be efficiently performed FIG. 15 shows a sectional view of an essential part illustrating a state where the folded-back portion is folded back of another embodiment (an embodiment in which an inspecting device is used as an electronic device) of the suspension board with circuit of the present invention.

In the above-described description, the light emitting device 40 is used as an electronic device. Alternatively, for example, as shown in FIG. 15, an inspecting device 50 can be used as the electronic device.

That is, the suspension board with circuit 1 is capable of being mounted with the slider 39 on the top surface side and being mounted with the inspecting device 50 on the back surface side. The suspension board with circuit 1 is mounted with the slider 39 mounted with the magnetic head 38 and the inspecting device 50, and the suspension board with circuit 1 is mounted on the hard disk drive.

An example of the inspecting device 50 is not particularly limited. For example, a device that generates an electrical signal according to vibration, pressure, and the like is used.

As shown in FIG. 15, when the electronic device serves as the inspecting device 50, in the same manner as described above, when the folded-back portion 10 is folded back, the inspecting device 50 is mounted on the slider 39 and the slider 39 is disposed in opposed relation to the magnetic disk 32, which is shown in the phantom lines, in the thickness direction.

When the suspension board with circuit 1 is used in the hard disk drive, the slider 39 usually travels relatively with respect to the magnetic disk 32 and is floated at minute spaced intervals thereto. However, when the position and the angle of the magnetic head 38 and the slider 39 in the suspension board with circuit 1 are defective, a disadvantage may occur such that the slider 39 comes into contact with the magnetic disk 32.

On the other hand, the above-described suspension board with circuit 1 is capable of being mounted with the inspecting device 50. The inspecting device 50 is mounted on the suspension board with circuit 1 and the slider 39 is allowed to travel relatively with respect to the magnetic disk 32. Then, when the slider 39 comes into contact with the magnetic disk 32, the inspecting device 50 detects the vibration, the pressure, and the like to generate the electrical signal.

Thus, a contact of the slider 39 with respect to the magnetic disk 32 can be recognized by detecting the electrical signal generated by the inspecting device 50, so that the presence or absence of a defect in the position, the angle, and the like of the magnetic head 38 and the slider 39 in the suspension board with circuit 1 can be inspected.

That is, the inspecting device 50, as the electronic device, is mounted on the suspension board with circuit 1, so that the position, the angle, and the like of the magnetic head 38 and the slider 39 in the suspension board with circuit 1 can be inspected.

Figure 16:
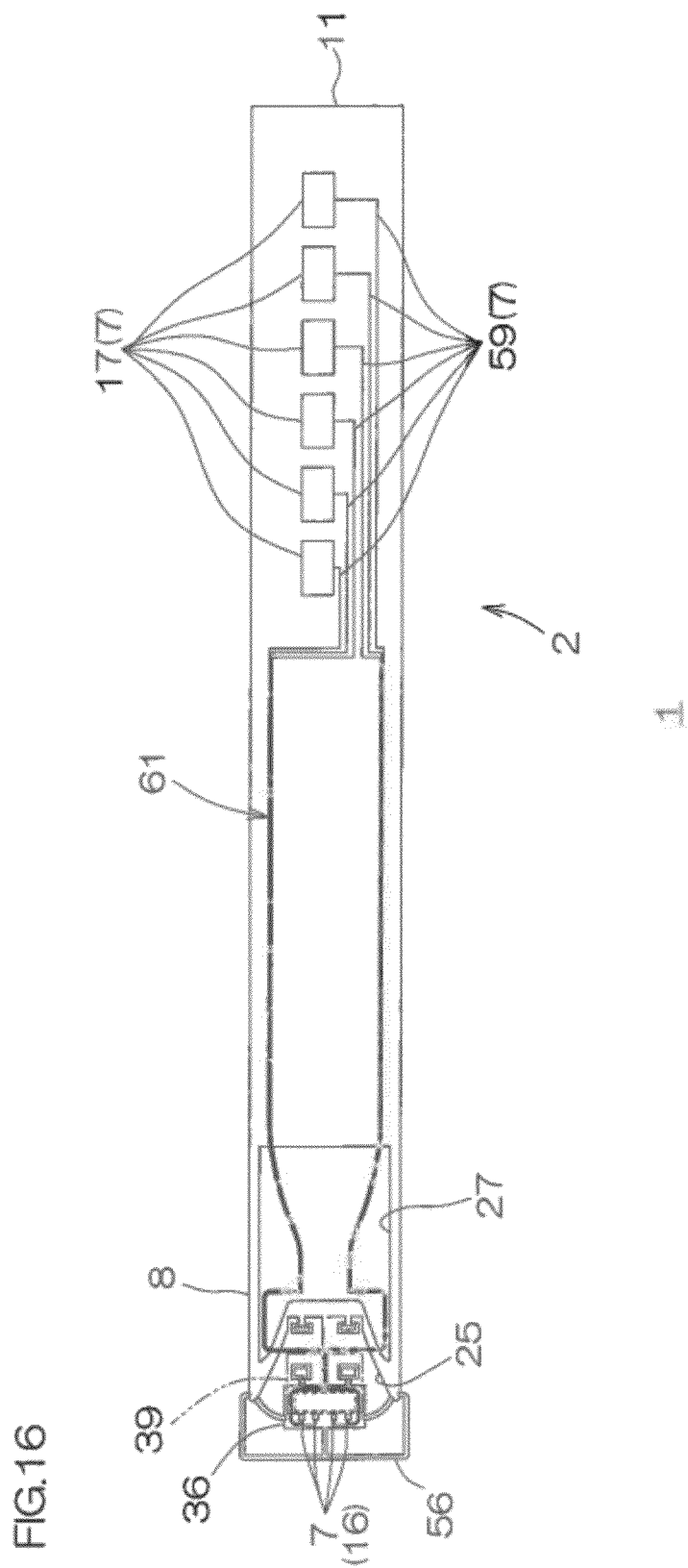
FIG. 16 shows a plan view of another embodiment (an embodiment in which a piezoelectric element is used as the electronic device) of the suspension board with circuit of the present invention.
Figure 17:
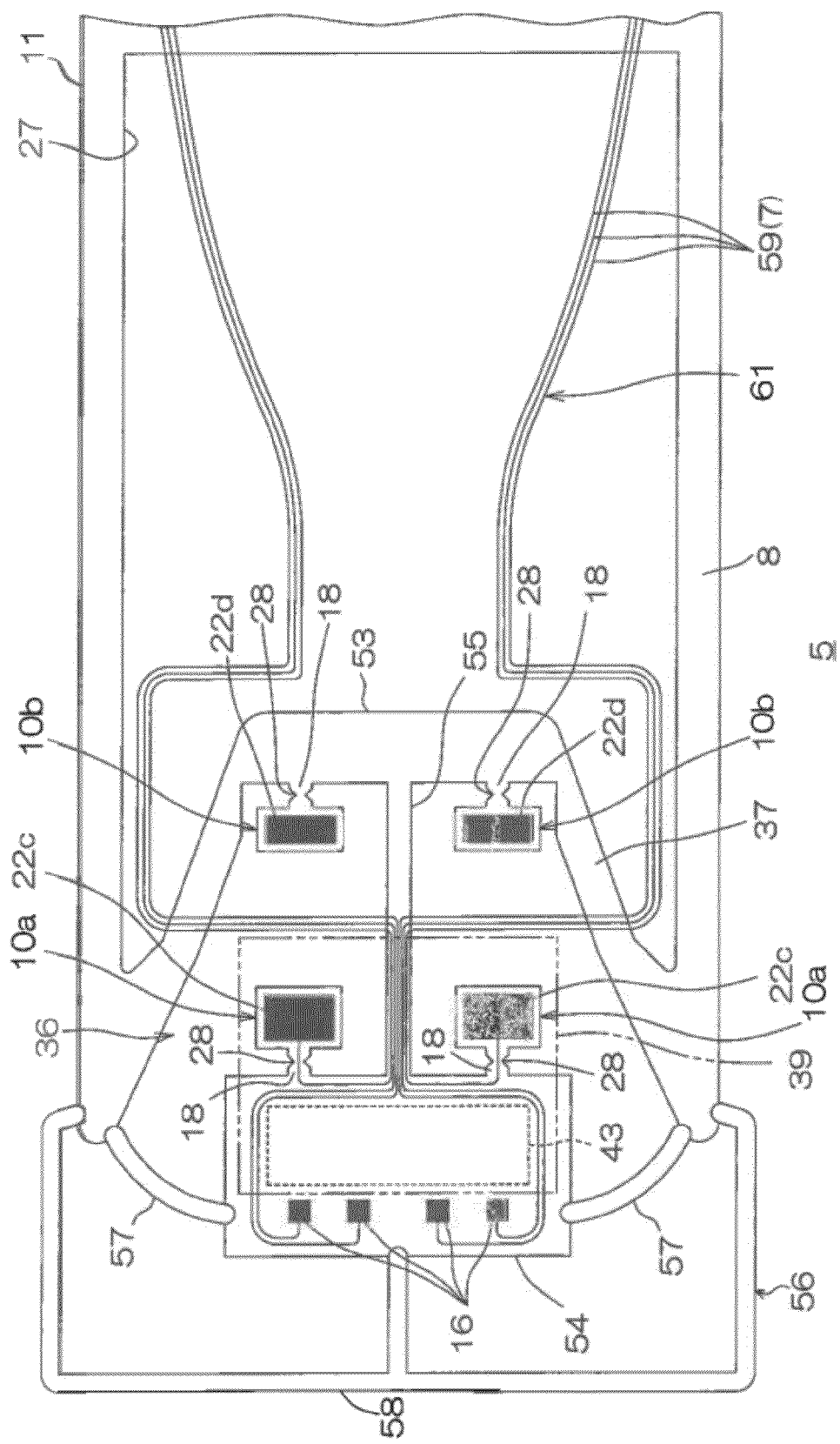
FIG. 17 shows an enlarged plan view of a gimbal portion of the suspension board with circuit shown in FIG. 16.
Figure 18:
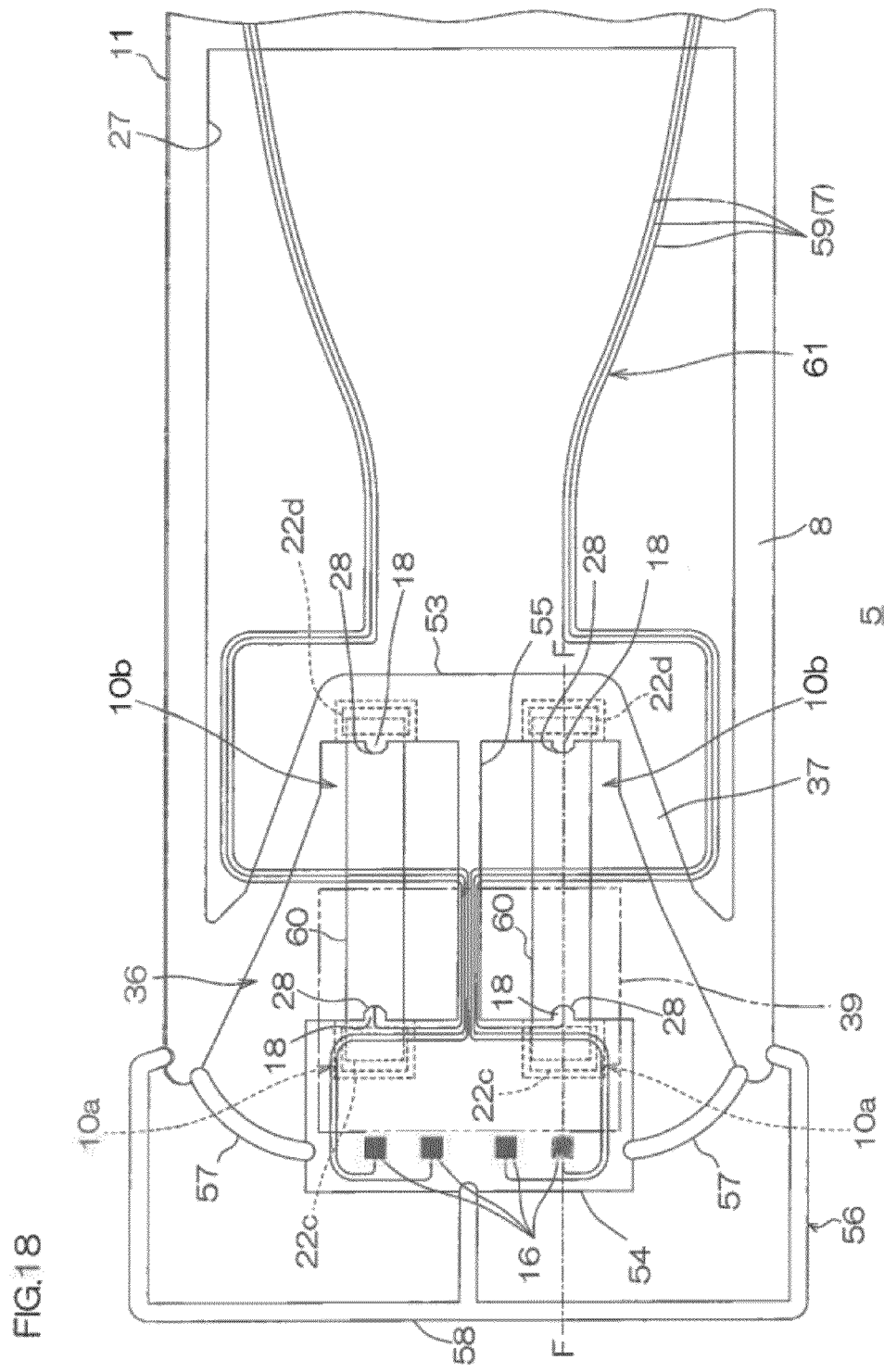
FIG. 18 shows a plan view illustrating a state where the folded-back portion is folded back in the gimbal portion shown in FIG. 17.
Figure 19:
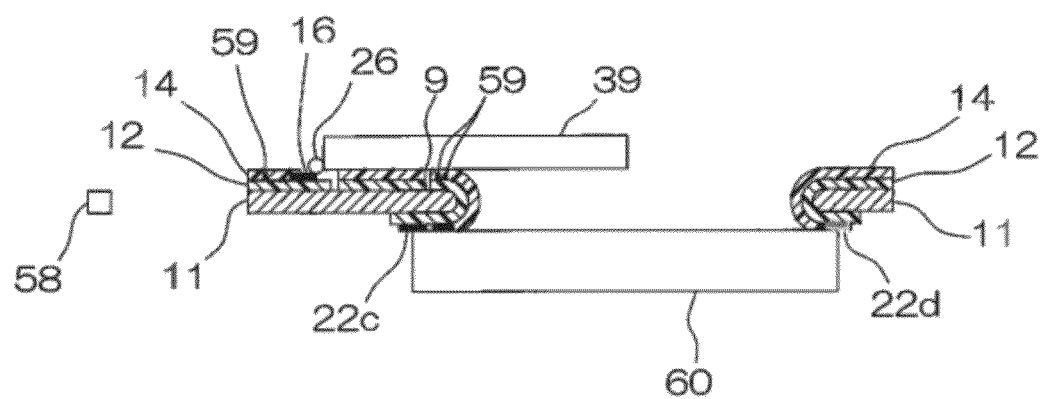
FIG. 19 shows a sectional view of an essential part, taken along the line F-F of the suspension board with circuit shown in FIG. 18.
Figure 20:
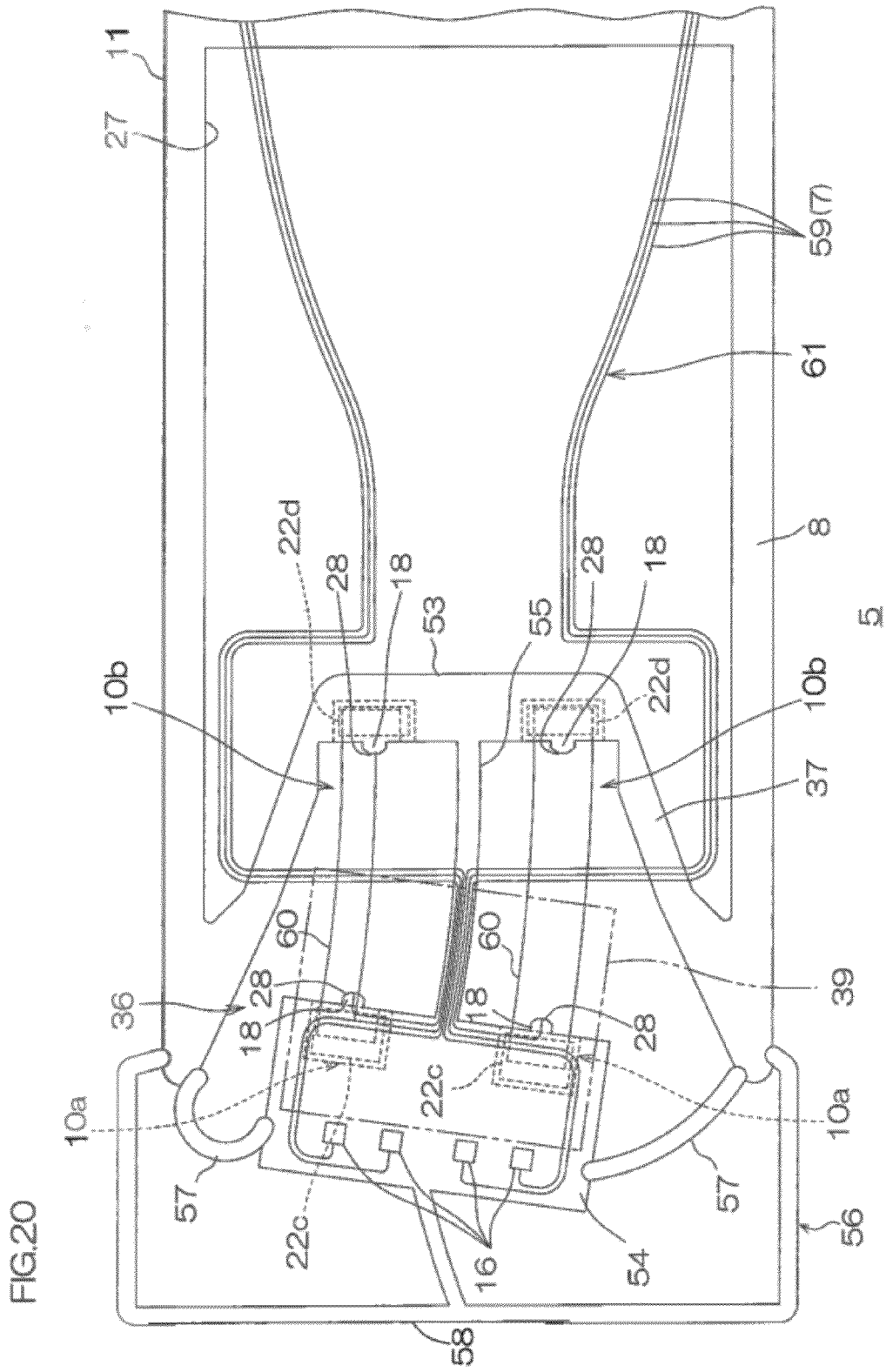
FIG. 20 shows a plan view illustrating a state where a slider mounting portion of the gimbal portion shown in FIG. 18 is pivoted.

FIG. 16 shows a plan view of another embodiment (an embodiment in which a piezoelectric element is used as the electronic device) of the suspension board with circuit of the present invention. FIG. 17 shows an enlarged plan view of a gimbal portion of the suspension board with circuit shown in FIG. 16. FIG. 18 shows a plan view illustrating a state where the folded-back portion is folded back in the gimbal portion shown in FIG. 17. FIG. 19 shows a sectional view of an essential part, taken along the line F-F of the suspension board with circuit shown in FIG. 18. FIG. 20 shows a plan view illustrating a state where a slider mounting portion of the gimbal portion shown in FIG. 18 is pivoted.

In the above-described description, the light emitting device 40 (or the inspecting device 50), as the electronic device, is used. Alternatively, as shown in FIGS. 16 to 20, for example, a piezoelectric element 60, as the electronic device, can be used.

That is, the suspension board with circuit 1 is capable of being mounted with the slider 39 on the top surface side and being mounted with the piezoelectric element 60 on the back surface side, and the folded-back portion 10 is folded back therein. The suspension board with circuit 1 is mounted with the slider 39 mounted with the magnetic head 38 and the piezoelectric element 60, and the suspension board with circuit 1 is mounted on the hard disk drive.

In FIGS. 16 to 18 and 20, the insulating cover layer 14 is omitted so as to clearly show the relative arrangement of the conductive pattern 7.

In the suspension board with circuit 1, the conductive pattern 7 is supported by the metal supporting board 11.

The metal supporting board 11 is formed into a generally rectangular flat belt shape in plane view extending in the lengthwise direction and integrally includes the wire portion (the main body portion) 2 and the gimbal portion 5 formed at the front side (the lengthwise one side, hereinafter the same) of the wire portion 2.

The wire portion 2 is formed into a generally rectangular shape in plane view.

The gimbal portion 5 is formed so as to extend from the front end of the wire portion 2 toward the front side. In the gimbal portion 5, an opening 27 in a generally rectangular shape in plane view penetrating in the thickness direction is formed.

The gimbal portion 5 includes the outrigger portions 8 that are divided at the outer side in the widthwise direction (the direction perpendicular to the lengthwise direction) of the opening 27 and a tongue portion 36 that is connected to the outrigger portions 8.

The outrigger portions 8 are formed so as to extend in a linear shape from the both widthwise end portions of the wire portion 2 toward the front side.

The tongue portion 36 is provided at the widthwise inner side of the outrigger portions 8 and is connected to the outrigger portions 8 via metal connecting portions 37 that extend from the front end portion of the outrigger portions 8 obliquely toward the rear side and the widthwise inner side. The tongue portion 36 is formed into a generally H-shape in plane view. The tongue portion 36 integrally includes a basal portion 53 that is formed into a generally rectangular shape in plane view extending long in the widthwise direction, a stage 54 that is disposed at the front side of the basal portion 53 in spaced relation thereto and is formed into a generally rectangular shape in plane view extending long in the widthwise direction, and a central portion 55 that connects the widthwise center of the basal portion 53 to that of the stage 54 and is formed into a generally rectangular shape in plane view that is long in the front-rear direction.

The center in the widthwise direction and the center in the front-rear direction of the stage 54 are defined as the slider mounting portion 43 on which the slider 39 is mounted. The stage 54 is connected to the outrigger portions 8 with a resin connecting portion 56.

In the slider mounting portion 43, in the same manner as in the suspension board with circuit 1 shown in FIG. 2, the pedestal 9 is provided (ref: FIG. 19).

The resin connecting portion 56 includes a first connecting portion 57 that connects the front end of each of the outrigger portions 8 to the both widthwise ends of the stage 54 in a curved state and a second connecting portion 58 that connects the front end of each of the outrigger portions 8 to the front end of the stage 54.

The first connecting portions 57 extend from the front ends of the outrigger portions 8 obliquely toward the front side and the widthwise inner side in a curved state to reach the both widthwise ends of the stage 54.

The second connecting portion 58 is formed into a generally E-shape in plane view and to be specific, extends from the front ends of the both outrigger portions 8 toward the front side and then bends toward the widthwise inner side. After extending toward the widthwise inner side to be united, the second connecting portion 58 bends toward the rear side to reach the front end of the stage 54.

The central portion 55 is formed with the width narrow so as to be capable of being curved in the widthwise direction.

In the gimbal portion 5, the penetrating space 25 penetrating the suspension board with circuit 1 in the thickness direction is defined as a space that is surrounded by the basal portion 53, the stage 54, the central portion 55, and the first connecting portion 57.

The penetrating space 25 includes a plurality (four pieces) of the folded-back portions 10 at the inner side thereof.

To be more specific, the folded-back portions 10 include a plurality (two pieces) of front-side folded-back portions 10*a* that are formed so as to protrude from the rear end edge of the widthwise outer side portion of the stage 54 toward the rear side and are disposed at spaced intervals to each other at the both widthwise outer sides of the central portion 55, and a plurality (two pieces) of rear-side folded-back portions 10*b* that are formed so as to protrude from the front end edge of the widthwise outer side portion of the basal portion 53 toward the front side and are disposed at spaced intervals to each other at the both widthwise outer sides of the central portion 55.

In the folded-back portion 10, the front-side folded-back portion 10*a* and the rear-side folded-back portion 10*b* form a pair (two pairs) with each other and are spaced in opposed relation to each other in the front-rear direction so as to sandwich the penetrating space 25.

The element-side terminal forming portion 46 is formed in each of the front-side folded-back portions 10a and each of the rear-side folded-back portions 10b.

The conductive pattern 7 includes the external-side terminal 17, the head-side terminal 16, the element-side terminal 22, and the wire 59.

A plurality (six pieces) of the external-side terminals 17 are provided on the rear end portion of the wire portion 2 and are disposed at spaced intervals to each other in the front-rear direction.

A plurality (four pieces) of the head-side terminals 16 are provided on the front end portion of the stage 54 and are disposed at spaced intervals to each other in the widthwise direction.

The element-side terminal 22 includes a front-side element terminal 22c that is formed in the element-side terminal forming portion 46 in the front-side folded-back portion 10a and a rear-side element terminal 22d that is formed in the element-side terminal forming portion 46 in the rear-side folded-back portion 10b.

In the element-side terminal 22, the front-side element terminal 22c and the rear-side element terminal 22d form a pair (two pairs) with each other and are disposed so as to sandwich the penetrating space 25.

The wire 59 is continuous to the external-side terminal 17, the head-side terminal 16, and the front-side element terminal 22c and electrically connects them to each other.

In the wire portion 2, a plurality (six pieces) of the wires 59 are formed at spaced intervals to each other in the widthwise direction.

To be specific, the wires 59 are arranged in the following manner. In the rear end portion of the wire portion 2, the wires 59 extend from the external-side terminals 17 toward the front side and in the middle of the front-rear direction of the wire portion 2, bend toward the both widthwise sides in two bunches in a branched state. Thereafter, the wires 59 bend toward the front side in the both widthwise end portions and extend toward the front end portion of the wire portion 2 along the widthwise outer end edges. In the gimbal portion 5, the wires 59 pass through the opening 27 and the metal connecting portion 37, then are pulled around so as to surround the basal portion 53, and subsequently, pass through between the front-side element terminal 22c and the rear-side element terminal 22d in the widthwise direction to reach the middle of the front-rear direction of the central portion 55 in a focused state. Then, the wires 59 bend toward the front side, subsequently extend along the central portion 55 toward the front side, and then in the rear end portion of the stage 54, curve toward the both widthwise sides in two bunches in a branched state. Thereafter, the wires 59 extend along the circumference end edges of the stage 54 and then turn to the front side and the rear side, respectively to finally reach the head-side terminals 16 and the front-side element terminals 22c.

Although not shown, the auxiliary pads 33 are formed on the back surface side in the middle of the wire 59 and on the back surface side of the element-side terminal 22.

Although not shown, the insulating base layer 12 and the insulating cover layer 14 are formed on and below the wire 59 and around the wire 59. The wire 59 forms a conductive region 61 together with the insulating base layer 12 and the insulating cover layer 14.

In the same manner as described above, the suspension board with circuit 1 includes the metal supporting board 11, the insulating base layer 12 that is formed on the metal supporting board 11, the conductive pattern 7 that is formed on the insulating base layer 12, and the insulating cover layer 14 that is formed on the insulating base layer 12 so as to cover the conductive pattern 7.

The metal supporting board 11 corresponds to the outer shape of the suspension board with circuit 1. To be specific, the metal supporting board 11 is formed corresponding to the wire portion 2, the outrigger portions 8, the metal connecting portion 37, the basal portion 53, the central portion 55, and the stage 54.

The insulating base layer 12 is formed over the wire portion 2 and the gimbal portion 5, corresponding to the portion where the conductive pattern 7 is formed. The insulating base layer 12 forms the conductive region 61 together with the conductive pattern 7.

To be specific, the insulating base layer 12 is, in the gimbal portion 5, formed along the wires 59 in the opening 27 and on the metal connecting portion 37, the central portion 55, and the stage 54 while in the wire portion 2, formed on the metal supporting board 11.

The insulating base layer 12 is, in the penetrating space 25, formed as a pattern corresponding to the folded-back portion 10 and also as a pattern forming the resin connecting portion 56.

As described above, the conductive pattern 7 is formed as a pattern including the external-side terminal 17, the head-side terminal 16, the element-side terminal 22 (the front-side element terminal 22c and the rear-side element terminal 22d), and the wire 59.

The wire 59 has a width in the range of, for example, 5 to 200 μm, or preferably 8 to 100 μm. The external-side terminal 17, the head-side terminal 16, the front-side element terminal 22c, and the rear-side element terminal 22d each have a width and a length (a length in the lengthwise direction) in the range of, for example, 20 to 1000 μm, or preferably 30 to 800 μm.

The insulating cover layer 14 is formed in a pattern of exposing the external-side terminal 17, the head-side terminal 16 and the element-side terminal 22, and covering the wire 59, over the wire portion 2 and the gimbal portion 5, in the portion where the insulating base layer 12 is formed. The insulating cover layer 14 forms the conductive region 61 together with the conductive pattern 7 and the insulating base layer 12.

As referred in FIGS. 18 and 19, in the suspension board with circuit 1, at the time of its use, the folded-back portion 10 is folded back, the slider 39 provided with the magnetic head 38 is mounted on the top surface side thereof via the pedestal 9, and the piezoelectric element 60 is mounted on the back surface side thereof.

The front end edge of the slider 39 is formed at the rear side of the head-side terminal 16 at minute spaced intervals thereto. The magnetic head 38 that is mounted on the front end portion of the slider 39 is electrically connected to the head-side terminal 16 via the solder ball 26.

The rear end edge of the slider 39 is disposed so as to pass over between the front-side element terminal 22c and the rear-side element terminal 22d, and over the middle of the front-rear direction of the central portion 55 in the widthwise direction.

At the back surface side of the suspension board with circuit 1, two pieces of the piezoelectric elements 60 are mounted so as each to be disposed between one pair of the front-side element terminal 22c and the rear-side element terminal 22d so that the piezoelectric element 60 is capable of stretching and shrinking in the front-rear direction.

That is, though the details are not shown, in the same manner as in the embodiment shown in FIG. 14, the piezoelectric elements 60 are disposed so as to cross over the penetrating space 25. The piezoelectric elements 60 are electrically connected to the element-side terminals 22 (the front-side element terminal 22c and the rear-side element terminal 22d) that are formed so as to sandwich the penetrating space 25 and are fixed thereto, respectively.

A minute space is provided between the upper surface of the piezoelectric element 60 and the conductive region 61, which is disposed between the metal connecting portion 37 and the central portion 55.

In the suspension board with circuit 1, electric power is supplied to the piezoelectric element 60 via the front-side element terminal 22c, so that the piezoelectric element 60 stretches and shrinks by controlling the electric voltage.

Next, the swinging of the slider 39 by the stretching and shrinking of the piezoelectric element 60 is described with reference to FIG. 20.

First, the electric power is supplied to the piezoelectric element 60 via the front-side element terminal 22c and the electric voltage of the electric power is controlled, so that one of the piezoelectric elements 60 shrinks. Then, the front-side element terminal 22c and the rear-side element terminal 22d that fix one of the piezoelectric elements 60 relatively come into close contact with each other. That is, one of the front-side element terminals 22c moves toward the rear side with respect to one of the rear-side element terminals 22d supported by the basal portion 53.

At the same time with this, the electric power is supplied via the front-side element terminal 22c and the electric voltage of the electric power is controlled, so that the other piezoelectric element 60 stretches. Then, the front-side element terminal 22c and the rear-side element terminal 22d that fix the other piezoelectric element 60 are relatively separated from each other. That is, the other front-side element terminal 22c moves toward the front side with respect to the other rear-side element terminal 22d supported by the basal portion 53.

In this way, the front end and the middle of the front-rear direction of the central portion 55 curve toward one side in the widthwise direction and the stage 54 swings toward one side in the widthwise direction with respect to the rear end of the central portion 55 as the fulcrum. With this, the slider 39 swings toward one side in the widthwise direction.

Then, as shown in FIG. 20, the widthwise one end portion of the rear end portion of the slider 39 is opposed to the conductive region 61 that is disposed between the metal connecting portion 37 and the central portion 55 in the thickness direction. On the other hand, the widthwise other end portion of the rear end portion of the slider 39 is separated from the above-described conductive region 61.

When one of the piezoelectric elements 60 stretches and the other thereof shrinks, the slider 39 swings toward the opposite direction to the description above.

In this way, in the above-described suspension board with circuit 1, the piezoelectric element 60, as an electronic device, is mounted thereon, so that the position, the angle, and the like of the magnetic head 38 can be finely adjusted.

In the above-described description, the penetrating space 25 is formed into a long hole shape and the folded-back portion 10 is provided at the inner side thereof. Alternatively, the penetrating space 25 can be formed only so as to form the folded-back portion 10. In that case, as referred in FIG. 21, for example, the penetrating space 25 can be formed into a generally squared U-shape in plane view opening toward the front side or the rear side in plane view. Also, as referred in FIG. 22, for example, the penetrating space 25 can be formed into a generally curved U-shape in plane view opening toward the front side or the rear side in plane view. The shape thereof in plane view is not particularly limited and can be selected arbitrarily.

Figure 21:
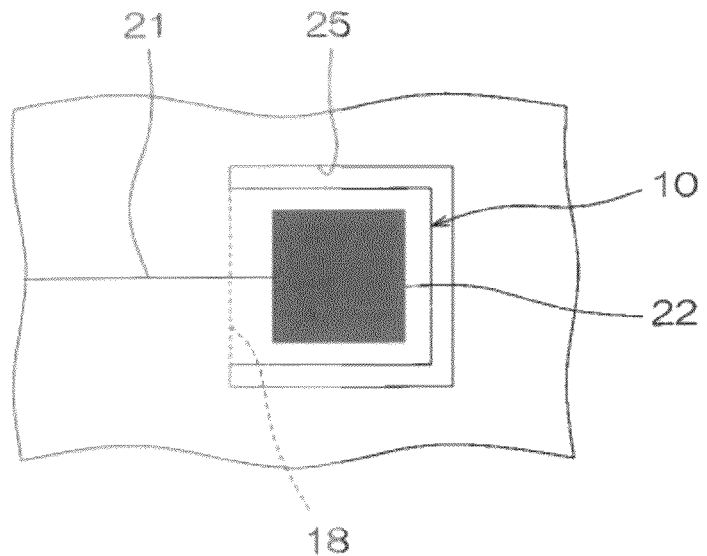
FIG. 21 shows a plan view of an essential part of another embodiment (an embodiment in which the penetrating space is formed into a generally squared U-shape in plane view) of the suspension board with circuit of the present invention.
Figure 22:
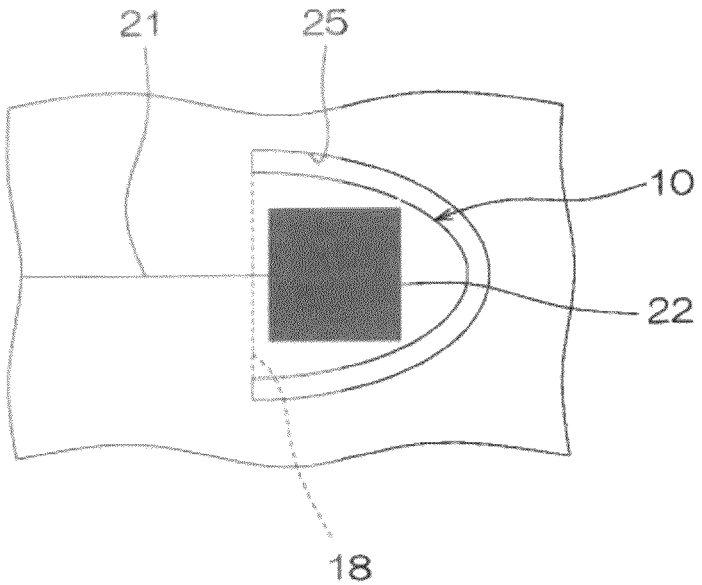
FIG. 22 shows a plan view of an essential part of another embodiment (an embodiment in which the penetrating space is formed into a generally curved U-shape in plane view) of the suspension board with circuit of the present invention.

In the above-described description, the folded-back portion 10 is continuous to the suspension board with circuit 1 around the folded-back portion 10 via the bent portion 18 in a generally rectangular shape in plane view. Alternatively, as shown in FIGS. 21 and 22, the folded-back portion 10 can be directly continuous to the suspension board with circuit 1 around the folded-back portion 10.

In that case, the bent portion 18 is defined as a boundary between the folded-back portion 10 and the suspension board with circuit 1 around the folded-back portion 10.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
    a conductive pattern on a top surface thereof, wherein
    a folded-back portion that is capable of being folded back toward a back surface side is provided in the suspension board with circuit, and
    at the circumference edge of the folded-back portion,
    a part of the circumference edge is continuous to the suspension board with circuit around the folded-back portion via a bent portion and
    the remaining portion of the circumference edge is disposed apart from the suspension board with circuit around the folded-back portion by a penetrating space that penetrates the suspension board with circuit in a thickness direction,
    wherein the conductive pattern at least includes a top-surface-side terminal that is disposed on the top surface of the suspension board with circuit and a back-surface-side terminal that is disposed in the folded-back portion, and wherein
    a slider mounted with a magnetic head is capable of being mounted on the top surface side thereof and an electronic device is capable of being mounted on the back surface side thereof;
    the conductive pattern includes
    a first conductive pattern including a first terminal that is to be electrically connected to an external circuit and a second terminal that is to be electrically connected to the magnetic head, and
    a second conductive pattern including a third terminal that is to be electrically connected to the external circuit and a fourth terminal that is to be electrically connected to the electronic device; and
    the top-surface-side terminal serves as the second terminal and
    the back-surface-side terminal serves as the fourth terminal.

2. The suspension board with circuit according to claim 1, wherein
    the second terminal and the fourth terminal are disposed so that
    in a state where the folded-back portion is folded back, the slider is capable of being opposed to the electronic device, the slider is capable of being connected to the second terminal, and the electronic device is capable of being connected to the fourth terminal.

3. The suspension board with circuit according to claim 1, wherein
the penetrating space is capable of allowing the electronic device to penetrate through.

4. The suspension board with circuit according to claim 1, wherein
at least one pair of the folded-back portions and at least one pair of the fourth terminals are provided, and
in a state where the folded-back portion is folded back,
at least one pair of the fourth terminals are disposed so as to sandwich the penetrating space.

5. The suspension board with circuit according to claim 4, wherein
the electronic device is capable of being disposed so as to cross over the penetrating space.

6. The suspension board with circuit 1 according to claim 5, wherein
the electronic device serves as a piezoelectric element.

7. The suspension board with circuit according to claim 1, wherein
the electronic device serves as a light emitting device and the slider includes an optical waveguide and a near-field light generation member.

8. The suspension board with circuit according to claim 7, wherein
the penetrating space is disposed so that in a state where the folded-back portion is folded back, the light emitted from the light emitting device is allowed to pass through to enter the optical waveguide.

9. The suspension board with circuit according to claim 1, wherein
the electronic device serves as an inspecting device.

10. A suspension board with circuit comprising:
a conductive pattern on a top surface thereof, wherein
a folded-back portion that is capable of being folded back toward a back surface side is provided in the suspension board with circuit, and
at the circumference edge of the folded-back portion,
a part of the circumference edge is continuous to the suspension board with circuit around the folded-back portion via a bent portion and
the remaining portion of the circumference edge is disposed apart from the suspension board with circuit around the folded-back portion by a penetrating space that penetrates the suspension board with circuit in a thickness direction,
wherein the conductive pattern at least includes a top-surface-side terminal that is disposed on the top surface of the suspension board with circuit and a back-surface-side terminal that is disposed in the folded-back portion, and wherein
the conductive pattern includes an auxiliary pad in the folded-back portion and an auxiliary pad in the suspension board with circuit around the folded-back portion.

11. The suspension board with circuit according to claim 10, wherein
the auxiliary pads form a pair and
in a state where the folded-back portion is folded back,
at least one pair of the auxiliary pads are opposed to each other in the thickness direction of the suspension board with circuit.

12. The suspension board with circuit according to claim 11, wherein
at least one pair of the auxiliary pads are subjected to ultrasonic bonding, so that
the folded-back portion is capable of being fixed to the back surface side of the suspension board with circuit.

13. The suspension board with circuit according to claim 11, wherein
at least one pair of the auxiliary pads are subjected to solder bonding, so that
the folded-back portion is capable of being fixed to the back surface side of the suspension board with circuit.

14. The suspension board with circuit according to claim 13, wherein
a penetrating hole that is capable of being filled with solder is formed in at least one of one pair of the auxiliary pads and
by filling the penetrating hole with the solder, at least one pair of the auxiliary pads are capable of being connected to each other.

\* \* \* \* \*